United States Patent
Ohto et al.

(10) Patent No.: US 7,763,979 B2
(45) Date of Patent: Jul. 27, 2010

(54) ORGANIC INSULATING FILM, MANUFACTURING METHOD THEREOF, SEMICONDUCTOR DEVICE USING SUCH ORGANIC INSULATING FILM AND MANUFACTURING METHOD THEREOF

(75) Inventors: Koichi Ohto, Kanagawa (JP); Tatsuya Usami, Kanagawa (JP); Noboru Morita, Kanagawa (JP); Kazuhiko Endo, Tokyo (JP)

(73) Assignees: NEC Electronics Corporation (JP); NEC Corporation (JP)

( * ) Notice: Subject to any disclaimer, the term of this patent is extended or adjusted under 35 U.S.C. 154(b) by 764 days.

(21) Appl. No.: 11/534,941

(22) Filed: Sep. 25, 2006

(65) Prior Publication Data
US 2007/0246804 A1    Oct. 25, 2007

Related U.S. Application Data

(62) Division of application No. 10/748,821, filed on Dec. 30, 2003, now abandoned.

(30) Foreign Application Priority Data
Jan. 14, 2003  (JP) .............................. 2003-006285

(51) Int. Cl.
H01L 25/34  (2006.01)
(52) U.S. Cl. ................. 257/759; 257/751; 257/758; 257/642; 257/E39.007
(58) Field of Classification Search ............. 257/751, 257/758, 642, 759, E39.007
See application file for complete search history.

(56) References Cited

U.S. PATENT DOCUMENTS 5,210,162 A * 5/1993 Eck et al. .................... 526/192
5,484,751 A * 1/1996 Colombier et al. ............ 501/87

(Continued)

FOREIGN PATENT DOCUMENTS

JP    57-211239    12/1982

(Continued)

OTHER PUBLICATIONS

Jiang L.: Chen X; Wang X; Xu L.; Stubhan F.; Merkel K.-H. a-SiCx:H films deposited by plasma-enhanced chemical vapor deposition at low temperature used for moisture and corrosion resistant applications, Thin Solid Films, vol. 352, No. 1, Sep. 8, 1999, pp. 97-101(5).

(Continued)

Primary Examiner—Eugene Lee
(74) Attorney, Agent, or Firm—Hayes Soloway P.C.

(57) ABSTRACT

The dielectric constants of SiC and SiCN that are currently the subjects of much investigation are both 4.5 to 5 or so and that of SiOC, 2.8 to 3.0 or so. With further miniaturization of the interconnection size and the spacing of interconnections brought about by the reduction in device size, there have arisen strong demands that dielectric constants should be further reduced.

Furthermore, because the etching selection ratio of SiOC to SiCN as well as that of SiOC to SiC are small, if SiCN or SiC is used as the etching stopper film, the surface of the metal interconnection layer may be oxidized at the time of photoresist removal, which gives rise to a problem of high contact resistance.

The present invention relates to an organic film made of one of SiOCH, SiCHN and SiCH that is formed using, as a source, a polyorganosilane whose C/Si ratio is at least 5 or greater and molecular weight is 100 or greater, and a semiconductor device wherein such an organic insulating film is used, and more particularly to a semiconductor device having a trench structure.

26 Claims, 22 Drawing Sheets

U.S. PATENT DOCUMENTS

| | | | |
|---|---|---|---|
| 5,489,662 A | 2/1996 | Wakamatsu et al. | 528/14 |
| 6,159,871 A * | 12/2000 | Loboda et al. | 438/786 |
| 6,162,743 A | 12/2000 | Chu et al. | 438/781 |
| 6,331,479 B1 * | 12/2001 | Li et al. | 438/618 |
| 6,426,249 B1 | 7/2002 | Geffken et al. | 438/239 |
| 6,514,855 B1 | 2/2003 | Suzuki et al. | 438/637 |
| 6,624,053 B2 * | 9/2003 | Passemard | 438/584 |
| 6,744,090 B2 * | 6/2004 | Kim | 257/301 |
| 6,764,774 B2 * | 7/2004 | Grill et al. | 428/641 |
| 6,784,485 B1 | 8/2004 | Cohen et al. | 257/325 |
| 6,797,652 B1 * | 9/2004 | Ngo et al. | 438/687 |
| 6,858,539 B2 * | 2/2005 | Minamihaba et al. | 438/692 |
| 6,890,869 B2 * | 5/2005 | Chung | 438/794 |
| 6,917,108 B2 * | 7/2005 | Fitzsimmons et al. | 257/751 |
| 6,939,800 B1 * | 9/2005 | Lu et al. | 438/643 |
| 7,023,093 B2 * | 4/2006 | Canaperi et al. | 257/760 |
| 2001/0004550 A1 | 6/2001 | Passemard | 438/618 |
| 2002/0113316 A1 * | 8/2002 | Shioya et al. | 257/762 |
| 2003/0235710 A1 | 12/2003 | Grill et al. | 428/641 |
| 2004/0096672 A1 * | 5/2004 | Lukas et al. | 428/446 |
| 2004/0124420 A1 * | 7/2004 | Lin et al. | 257/77 |
| 2006/0069176 A1 * | 3/2006 | Bowman et al. | 522/1 |

FOREIGN PATENT DOCUMENTS

| | | |
|---|---|---|
| JP | 07-082379 | 3/1995 |
| JP | 10-284486 | 10/1998 |
| JP | 2001-127159 | 5/2001 |
| JP | 2001-223267 | 8/2001 |
| JP | 2001-274153 | 10/2001 |
| JP | 2001-274250 | 10/2001 |
| JP | 2001-313371 | 11/2001 |
| JP | 2002-033316 | 1/2002 |
| JP | 2002-083870 | 3/2002 |
| JP | 2002-118169 | 4/2002 |
| JP | 2002-275631 | 9/2002 |
| JP | 2004-507108 | 4/2004 |
| KR | 1998-019144 | 5/1998 |
| WO | WO 99/41423 | 8/1999 |
| WO | WO 00/19498 | 4/2000 |
| WO | WO 01/91181 | 11/2001 |

OTHER PUBLICATIONS

A.M. Wrobel, I. Blaszczyk, A. Walkiewicz-Pietrzykowska,; Remote hydrogen-nitrogen plasma chemical vapor deposition from a tetramethyldisilazane source. Part 1. Mechanism of the process, structure and surface morphology of deposited amorphous hydrogenated silicon carbonitride films, Journal of Materials Chemistry, 2003, 13, 731-737.

Mark A. Petrich, Karen K. Gleason, and Jeffrey A. Reimer; Structure and properties of amorphous hydrogenated silicon carbide, Phys. Rev. B 36, 9722-9731 (1987).

* cited by examiner

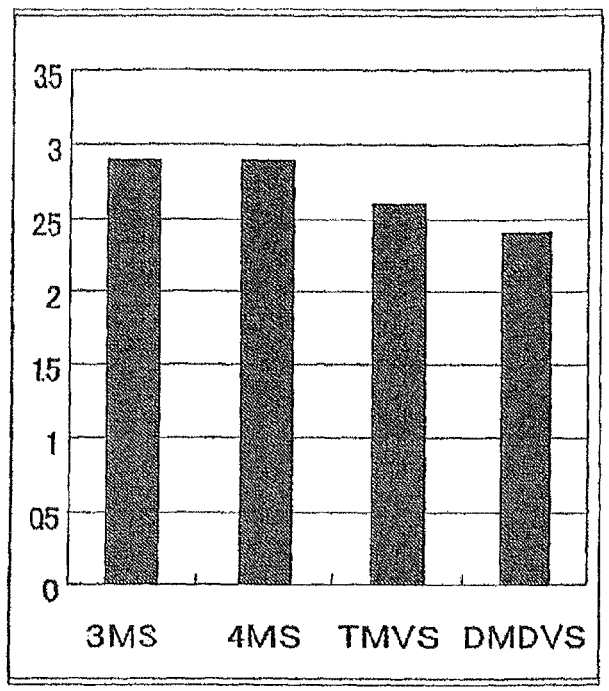
Fig.18  The dielectric constants of the SiOCH films formed with various gases.
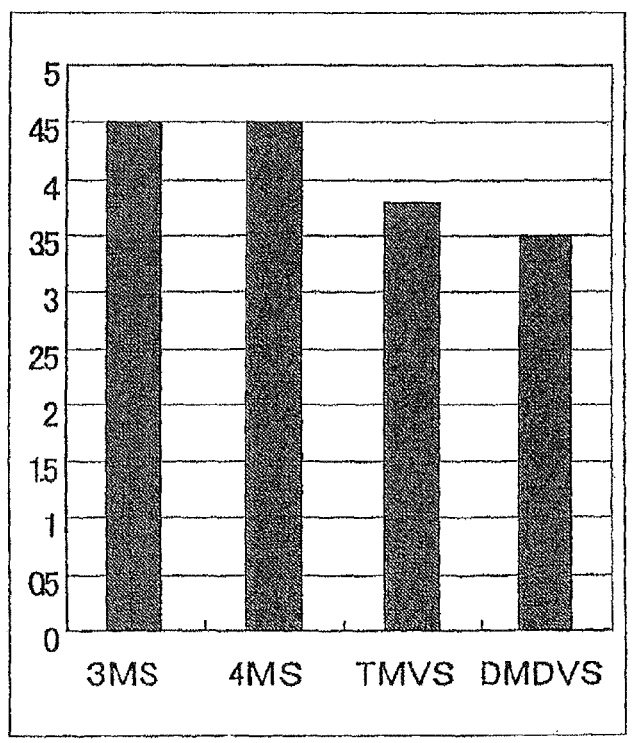
Fig.19  The dielectric constants of the SiCH films formed with various gases.

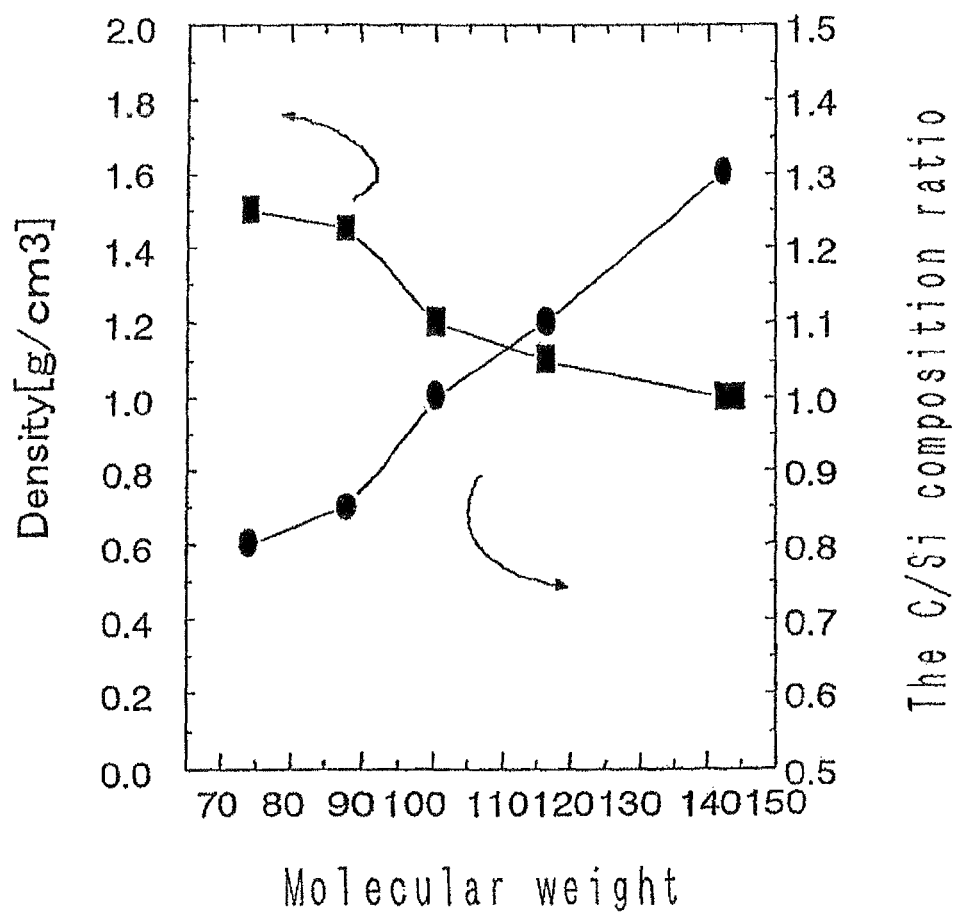
Fig. 20 The density and the composition of the SiCH film as a function of the molecular weight of the source gas.

ORGANIC INSULATING FILM, MANUFACTURING METHOD THEREOF, SEMICONDUCTOR DEVICE USING SUCH ORGANIC INSULATING FILM AND MANUFACTURING METHOD THEREOF

CROSS REFERENCE TO RELATED APPLICATIONS

This application is a divisional of U.S. application Ser. No. 10/748,821, filed Dec. 30, 2003 now abandoned.

BACKGROUND OF THE INVENTION

1. Field of the Invention

The present invention relates to an organic insulating film and a semiconductor device therewith and, more particularly, to a low-dielectric-constant organic insulating film and a manufacturing method thereof as well as a semiconductor device with a multi-layered interconnection structure wherein such a low-dielectric-constant organic insulating film is used for an interlayer insulating film and a manufacturing method thereof.

2. Description of the Related Art

In fabrication of the ICs (Integrated Circuits), accompanying advance in the speed of operation and the degree of integration in the device, further reduction in the device design rule has been in progress. The miniaturization of the interconnection size and the spacing of the interconnections made through such reduction in device size tend to increase the interconnection resistance and the capacitance between interconnections in inverse proportion thereto. Since these increases in interconnection resistance and capacitance between interconnections raise the RC time constant, the signal velocity is lowered, giving rise to a serious problem with respect to attaining higher speeds of operations in the device.

Accordingly, the reduction of the interconnection resistance and the capacitance between interconnections has become a matter of utmost importance to speed up operations in the device. With the object of reducing the interconnection resistance, the technique wherein copper having a lower electrical resistivity than aluminium hitherto widely used is employed as the interconnection material and the products manufactured therewith have become spreading.

Further, because the capacitance between interconnections increases in proportion to the area of interconnection and the dielectric constant of the insulating film separating interconnections and in inverse proportion to the distance between interconnections, for the sake of reducing the capacitance between interconnections without making any change in the device design, for instance, the use of an insulating film having a lower dielectric constant than the conventional oxide film ($SiO_2$) and nitride film (SiN) has been, for example, being much investigated.

When Cu is used for the interconnection material, owing to the difficulty Cu has in microfabrication with dry etching, a damascene interconnection structure such as shown in FIG. 1 is, in general, widely employed.

In the method of forming a damascene interconnection, an etching stopper film SiN insulating film 003 having an excellent etching selectivity to an interconnection trench $SiO_2$ interlayer insulating film 0002 that is to be formed subsequently, is first grown, on an underlying $SiO_2$ interlayer insulating film 0001, to a thickness of 50 nm to 150 nm by the parallel plate type plasma CVD (Chemical Vapor Deposition) method with $SiH_4$, $NH_3$ and $N_2$, and an interconnection trench $SiO_2$ interlayer insulating film 0002 is then grown to a thickness of 400 nm to 1000 nm or so. Next, a trench pattern is formed by means of photolithography and dry etching, and thereafter the resist pattern is removed by means of $O_2$ dry ashing and wet peeling-off. Using the sputtering technique and plating technique, the trench pattern is then filled up with Cu as well as a barrier metal such as Ta or TaN which is used to prevent the Cu diffusion and superfluous portions of the Cu and the barrier metal laid on the interconnection trench $SiO_2$ interlayer insulating film 0002 are removed by the CMP (Chemical Mechanical Polishing) to form a Cu interconnection 0007.

In the case that an interlayer insulating film is formed after the damascene interconnection formation, because Cu is liable to react with $SiO_2$ to diffuse out, a via plug $SiO_2$ interlayer insulating film 0010 is normally grown after a SiN film 0012 is grown on the Cu as a diffusion-prevention insulating film (barrier insulating film) to a thickness of 50 nm to 100 nm or so by the parallel plate type plasma CVD method using $SiH_4$, $NH_3$ and $N_2$.

Hereat, SiN not only prevents the Cu diffusion but also acts as am etching stopper layer for the $SiO_2$ film so that the Cu surface may be prevented from being exposed to the atmosphere of $SiO_2$ etching at the time of the trench etching for the Cu and the atmosphere of $O_2$ resist ashing at the time of forming a via hole above a damascene interconnection of Cu. SiN is, in effect, required to work for prevention of the diffusion and, at the same time, function as an etching stopper layer.

In recent years, for the purpose of reducing the parasitic capacitance between interconnections further, there have been widely investigated the use of an organic insulating film of SiOF, SiOC or such, which has a lower dielectric constant than that of a conventional $SiO_2$ film of 4.1, together with the use of an organic insulating film of SiC or SiCN with a dielectric constant of 4.5 to 5 or so, formed by the parallel plate type plasma CVD method using, as a source, 4MS (tetramethylsilane) or 3MS (triethylsilane) which has a lower dielectric constant than that of SiN of 7.

FIGS. 15(*a*) to 16(*c*) illustrate a conventional method in which SiC films or SiCN films grown conventionally using 3MS as a source gas are employed.

After forming a first Cu interconnection 805, a second SiCN film 806 is grown, using the afore-mentioned gas. Next, a second SiOC film 807 and a third SiCN film 808 are formed, in the same way, using the afore-mentioned gas and, thereon, a third SiOC film 809 and a second $SiO_2$ film 810 are grown.

As shown in FIG. 15(*a*), using, as a mask, a photoresist where a resist pattern for via hole is formed, etching is applied onto the second $SiO_2$ film 810, the third SiOC film 809, the third SiCN film 808 and the second SiOC film 807 to be terminated above the second SiCN film 806.

However, there are occasions in which the etching selection ratio between SiOC and SiCN is small so that the etching proceeds to the interconnection lying in the lower layer as shown in FIG. 15(*b*). In that case, when ashing by $O_2$ gas is thereafter carried out to peel off the photoresist, an oxide layer 831 of Cu is formed in a region where the Cu interconnection has been subjected to the etching. The same also happens when a film of either of SiOC and SiC is utilized.

Next, as shown in FIG. 15(*c*), after applying a coating of an anti-reflection coating film thereto, a second resist pattern for trench interconnection 819 is formed through a photoresist 818.

As shown in FIG. 15(*d*), using the photoresist 818 as a mask, etching is applied to the second $SiO_2$ film 810 and the third SiC film 808. After that, the photoresist 818 is peeled off by oxygen ashing, which may result in further oxidation of the afore-mentioned oxide layer 831 of Cu, and thereafter the organic peeling-off is carried out.

With the entire surface etch-back, the second SiCN film 806 is then etched away, as shown in FIG. 16(a). Next, as shown in FIG. 16(b), after a second Ti/TiN film 820 is formed, a second Cu film 821 is formed. Subsequently, the metal other than the trench interconnection is removed to form a second Cu interconnection 832. Thereon, a fourth SiCN film 822 is formed, as shown in FIG. 16(c).

The SiC film, the SiCN film and the SiOC film formed by the parallel plate type plasma CVD method using, as a source material, 4MS (tetramethylsilane) or 3MS (trimethylsilane) are currently under wide investigation. The dielectric constants for SiC and SiCN are 4.5 to 5 or so, and the dielectric constant for SiOC is 2.8 to 3.0 or so.

With further miniaturization of the interconnection size and the spacing of interconnections brought about by the reduction in device size, there have arisen strong demands that dielectric constants should be further reduced.

Furthermore, because the etching selection ratio of SiOC to SiCN as well as that of SiOC to SiC are small, if SiCN or SiC is used as the etching stopper film, the surface of the metal interconnection layer may be oxidized at the time of photoresist removal, which gives rise to a problem of high contact resistance.

SUMMARY OF THE INVENTION

The present invention relates to an organic insulating film with a low dielectric constant that can be advantageously used in a semiconductor device and a semiconductor device in which such an organic insulating film is utilized.

An organic insulating film with a low dielectric constant of the present invention is an organic insulating film formed using, as a source, a polyorganosilane whose C/Si ratio is, at least, equal to or greater than 5 and, at the same time, molecular weight is equal to or greater than 100. This organic insulating film is grown by the plasma CVD method using a polyorganosilane with a molecular weight of 100 or higher as a source.

The polyorganosilane is preferably one or more types of polyorganosilanes selected from the group consisting of trimethylvinylsilane, triethlvinylsilane, dimethyldivinylsilane, diethyldivinylsilane, methyltrivinylsilane, ethyltrivinylsilane, tetravinylsilane, tetraethylsilane and triethylsilane.

Further, the organic insulating film preferably contains a C=C bond, and moreover the presence of a vinyl group is known to improve the heat resistance thereof.

Hereat, the polyorganosilane that is to be used as a source preferably contains a vinyl group, at least, in its part. Such a polyorganosilane containing a vinyl group, at least, in its part is preferably one or more types of polyorganosilanes selected from the group consisting of trimethylvinylsilane, triethlvinylsilane, dimethyldivinylsilane, diethyldivinylsilane, methyltrivinylsilane, ethyltrivinylsilane and tetravinylsilane.

Especially in the case of the SiOH film, an oxidizing agent, an inert gas and a polyorganosilane whose C/Si ratio is at least equal to or greater than 5 and, at the same time, molecular weight is equal to or greater than 100 are required as the source gases. The inert gas can be any one of helium, argon and xenon, and the oxidizing agent can be any one selected from the group consisting of $O_2$, $O_3$, $H_2O$, CO and $CO_2$.

The oxidizing agent can be an oxidizing gas containing nitrogen, but this gas is not suitable for the novolak-based photoresist which is currently in wide use.

The polyorganosilane that is to be used as the source may be one or more types of polyorganosilanes selected from the group consisting of trimethylvinylsilane, triethlvinylsilane, dimethyldivinylsilane, diethyldivinylsilane, methyltrivinylsilane, ethyltrivinylsilane, tetravinylsilane, tetraethylsilane and triethylsilane, but, from the viewpoint of improving the heat resistance, the presence of a vinyl group therein is preferable.

In the case of the SiCH film, the source gases are an inert gas that is one of helium, argon and xenon, and a polyorganosilane whose C/Si ratio is, at least, equal to or greater than 5 and, at the same time, molecular weight is equal to or greater than 100. In this case, too, the polyorganosilane may be one or more types of polyorganosilanes selected from the group consisting of trimethylvinylsilane, triethlvinylsilane, dimethyldivinylsilane, diethyldivinylsilane, methyltrivinylsilane, ethyltrivinylsilane, tetravinylsilane, tetraethylsilane and triethylsilane, and, especially if it contains a vinyl group, the heat resistance can be improved.

The source gases for the SiCHN film are a nitrogen containing gas, an inert gas that is one of helium, argon and xenon, and a polyorganosilane whose C/Si ratio is, at least, equal to or greater than 5 and, at the same time, molecular weight is equal to or greater than 100. Examples of the nitrogen containing gas include ammonia, $N_2$ and hydrazine. The polyorganosilane may be one or more types of polyorganosilanes selected from the group consisting of trimethylvinylsilane, triethlvinylsilane, dimethyldivinylsilane, diethyldivinylsilane, methyltrivinylsilane, ethyltrivinylsilane, tetravinylsilane, tetraethylsilane and triethylsilane, and, especially if it contains a vinyl group in its part, the heat resistance can be improved.

In the conventional semiconductor device, normally a SiOCH film can substitute for a $SiO_2$ film, and a SiCH film or a SiCHN film, for a SiN film.

For application of the organic insulating film of the present invention to semiconductor devices, the semiconductor integrated circuit device with a multi-layered structure is a good candidate for that. The semiconductor device with a trench interconnection structure that has, following the progress in miniaturization, started gaining ground is, in particular, well suited.

BRIEF DESCRIPTION OF THE DRAWING

FIG. 18 is a graphical representation showing the dielectric constants of the SiOCH films formed with various gases.

FIG. 19 is a graphical representation showing the dielectric constants of the SiCH films formed with various gases.

FIG. 20 is a graphical representation depicting the density and the composition of the SiCH film as a function of the molecular weight of the source gas.

DETAILED DESCRIPTION OF THE INVENTION AND PREFERRED EMBODIMENTS

A structure and a manufacturing method of an organic insulating film that is a preferred embodiment of the present invention are described below.

In order to reduce the dielectric constant of the organic insulating film, the C/Si composition ratio in the film must be set higher than that of a conventional film of SiC, SiCN or SiOC, and this leads to the use of a source gas which has a larger C/Si composition ratio than 4MS or 3MS.

On the other hand, when the C/Si ratio in the film is set high, the C—C bonds tend to appear in the film, and, the bond energy of the C—C bonds being smaller than the bond energy of the Si—O, Si—C or Si—N bonds, the C—C bonds may be easily broken down and, thus, the film of this sort may have a low heat resistance. To increase the heat resistance, it is effective to make a film contain the C=C bonds whose bond energy is higher than that of C—C bonds.

The organic insulating film with C=C bonds can be certainly formed by keeping the electric power or such for the plasma CVD under control but the use of a source gas which contains bonds of the vinyl group therein is more effective.

As for a method of lowering the dielectric constant of a film of SiCH, SiCHN or SiOCH, a reduction of the film density is effective. To reduce the film density, a material having a larger molecular weight than 4MS (tetramethylsilane) or 3MS (trimethylsilane) must be utilized, and besides the deposition must be made with a reduced plasma density so that the decomposition of the source gas in gas phase may be well suppressed.

Accordingly, the present invention provides films of SiCH, SiCHN and SiOCH each having a lower dielectric constant than conventional films of SiCH, SiCHN and SiOCH.

Further, the present invention relates to a semiconductor device in which a film of SiCH, SiCHN or SiOCH having a low dielectric constant is utilized and, more particularly, to a semiconductor layer of this sort with a trench structure.

Figure 17:
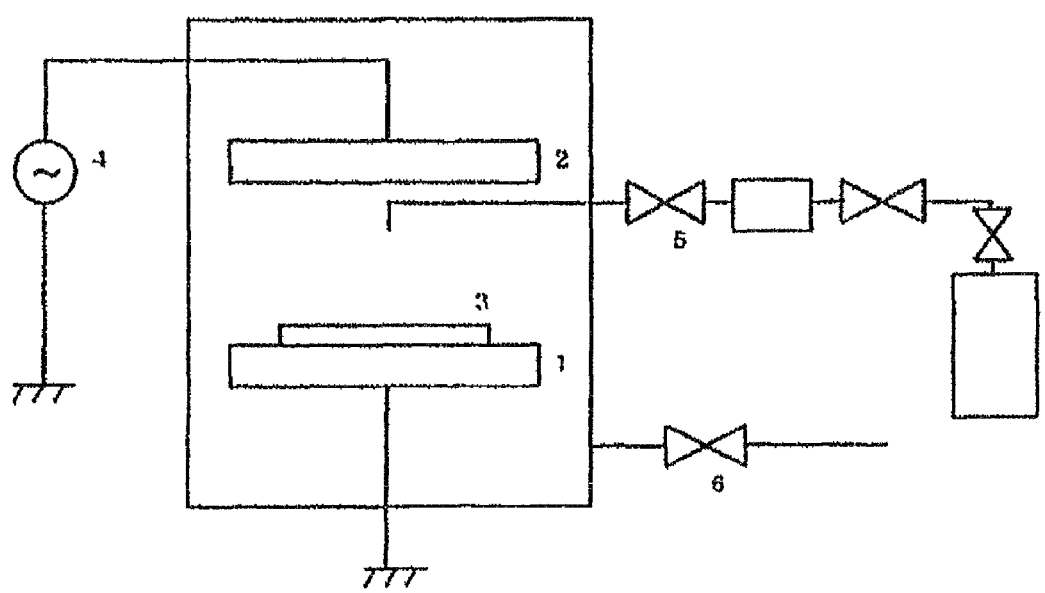
FIG. 17 is a schematic cross-sectional view in explaining the structure of the parallel plate type plasma CVD system used in the present invention.

Further, referring to FIG. 17, a parallel plate type plasma CVD apparatus utilized in this invention is described below.

The apparatus is provided with an upper electrode 1 and a lower electrode 2 within a vacuum tank, and, with a silicon substrate 3 being set on the lower electrode, the electric power with a high frequency produced by a high frequency electric power source 4 is applied onto the upper electrode. Further, it is possible to heat up the lower electrode with a heater. The apparatus is connected with a gas feeding section 5 for supplying the source gas for the apparatus, and a gas discharging section 6. The source supplying section is connected, through an encapsulating valve and a mass low controller, to a cylinder of the source gas, and the structure of the piping in the supplying section allows its heating up to 300° C. If a liquid source is employed as its source, the source supply may be made through a vaporized solution feeding apparatus in place of the mass flow controller.

Further, it has been confirmed that, in addition to the parallel plate type plasma CVD, the ECR (Electron Cyclotron Resonance) excited plasma CVD, the helicon wave excited plasma CVD and the induction coupled plasma CVD can be used to obtain a film of the same excellent quality.

In the first embodiment of the present invention, a SiOCH film is described in detail below.

For a SiOCH film in the first embodiment of the present invention, a Si wafer is disposed in an parallel plate type plasma CVD (referred to as PECVD hereinafter) apparatus and heated to 150 to 400° C., and trimethylvinylsilane (TMVS), $O_2$ and H E are fed into the PECVD apparatus at a flow rate of 200 to 2000 sccm (standard cubic centimeters minute), 50 to 1000 sccm and 50 to 500 sccm, respectively. The pressure in the chamber is set to be 133 to 1330 Pa and a RF (Radio Frequency) power of 200 to 1000 W is applied thereto.

A SiOCH film grown under the above conditions has a C/Si composition ratio of 0.8 to 1.3 and a film density of 1.1 $g/cm^3$ to 1.2 $g/cm^3$. This value for the C/Si composition ratio is higher and this value for the film density, lower, compared with respective values of those of a SiOCH film (with a C/Si composition ratio of 0.7 and a film density of 1.3 $g/cm^3$) that is grown using trimethylsilane (3MS) as a source gas and widely utilized as a conventional interlayer insulating film. Accordingly, being 2.2 to 2.7, its dielectric constant provides a lower value than the dielectric constant (2.8 to 3.0) of a SiOC film grown using trimethylsilane (3MS) as a source gas. Further, the refractive index of the films grown under the above conditions were found to be in a range of 1.3 to 1.45.

When the deposition of a SiOCH film is carried out with a RF power of 400 W or higher, the C/Si composition ratio becomes not less than 0.8 but not greater than 1.0, and because the C—C bonds are, in this instance, formed within the film, the film becomes thermally unstable and a heat treatment conducted at 400° C. for 30 minutes causes a decrease in film thickness by 5% or so. In contrast with this, when the deposition is performed with a RF power in a range of 200 to 400 W, the C=C bonds are formed in the film so that the heat resistance is increased and a decrease in film thickness brought about by a heat treatment conducted at 400° C. for 30 minutes becomes 1% or less.

While in the first embodiment trimethylvinylsilane is used for the source gas, one type or a combination of two or more types selected from the group consisting, for example, dimethyldivinylsilane, diethyldivinylsilane, methyltrivinylsilane, ethyltrivinylsilane, tetravinylsilane, tetraethylsilane and triethylsilane may be employed.

In particular, trimethylvinylsilane, dimethyldivinylsilane, diethyldivinylsilane, methyltrivinylsilane, ethyltrivinylsilane, tetravinylsilane, any of which contains the vinyl group, are preferable.

If a gas such as $N_2O$ or $NO_2$ is used as an oxidizing gas, a very small amount of N elements left in the SiOCH film may make up amine groups. Once amine groups are formed in the film, the use of a novolak-based photoresist leads to faulty exposure, since the amine group react with the photoresist, and therefore such an oxidizing gas as containing nitrogen cannot be used.

Next, in the second embodiment of the present invention, a SiCH film is described below.

In the present embodiment, a parallel plate type plasma CVD apparatus is utilized.

With a mass flow controller regulating the flow rates, trimethylvinylsilane is fed thereto at a rate of 300 sccm and H E is concurrently, at a rate of 1000 sccm. At the time of the film deposition, the pressure is set to be 133 Pa to 1330 Pa, the high frequency electric power, 100 to 400 W and the substrate temperature, 350° C.

The measurements of the dielectric constants for the films fabricated under the above conditions revealed that their values change continuously with the deposition pressure, from a dielectric constant of 3.3 for the film grown at 133 Pa to a dielectric constant of 4.2 for the film grown at 1330 Pa.

It was vindicated that the dielectric constants for these films can be made lower than those for the films grown using 3MS or 4MS (the dielectric constants for them are 4.5).

Further, when the films were grown under the above conditions, the C/Si composition ratios therein varied in a range of 0.9 to 1.4 and the film densities, in a range of 0.9 to 1.4 $g/cm^3$. These results indicate that the films are made to have lower densities than the SiCH films (with a C/Si composition ratio of 0.8 and a density of 1.5 $g/cm^3$) grown using 3MS, which are considered to bring about reductions of the dielectric constants.

Further, the refractive indices of the films grown under the above conditions vary in a range of 1.70 to 1.85. The results of the measurements of the FT-IR (Fourier Transform-InfraRed) absorption spectroscopy indicated the presence of Si—C, Si—CH$_3$ and Si—H bonds. On the other hand, the Si—OH bands resulting from the moisture in the film were not detected.

The films were found to have the excellent capability as a barrier against Cu, and in the accelerated Cu diffusion test conducted applying a bias voltage while heating to 450° C., no Cu diffusion was observed. This indicates that these films have the capability equivalent to the conventional SiCH films grown with 3MS.

While, in the examples described so far, trimethylvinylsilane is used as a source, it was established that, in addition to this, triethylvinylsilane, dimethyldivinylsilane, diethyldivinylsilane, methyltrivinylsilane, ethyltrivinylsilane, tetravinylsilane, tetraethylsilane and triethylsilane, every one of which is a polyorganosilane possible to be used as a source having a molecular weight of 100 or greater and a C/Si ratio of 5 or greater, may form a film of a similar quality. The relationships between the molecular weight of the source compound and the density as well as the C/Si composition ratio of the deposited film for the cases that one of the above sources is used are shown in FIG. 20. It was clearly shown that the use of such a source with a molecular weight of 100 or greater and a C/Si ratio of 5 or greater enables to grow a film having a film density of not less than 1.0 $g/cm^3$ but not greater than 1.4 $g/cm^3$ and a C/Si composition ratio of not less than 0.9 but not greater than 1.3.

Further, it has been confirmed that, in addition to the parallel plate type plasma CVD, the ECR excited plasma CVD, the helicon wave excited plasma CVD and the induction coupled plasma CVD can be used to obtain a film of the same excellent quality.

Next, as a modified example of the second embodiment, a SiCH film containing vinyl groups therein is described below.

To make vinyl groups contained in the film, it is necessary to prevent the dissociation of the source by the plasma as much as possible. For that purpose, the film deposition was made under the conditions that the flow rate of trimethylvinylsilane was as much as 300 sccm or higher and the plasma electric power was as low as 50 to 100 W.

To examine the presence of vinyl groups in the film, measurements of the infrared absorption spectroscopy were conducted and the absorption attributable to vinyl groups was clearly observed in the sample film grown under the conditions of a high flow rate and a low high-frequency electric power of 50 to 100 W. This occurs because, in plasma with a weak energy, the source may be taken into a film without being broken down structurally.

Now, it was demonstrated that a SiCH film containing vinyl groups can be fabricated by using a source gas linking with vinyl groups and, at the same time, giving good attention to suppress the decomposition of the source gas. Further, the amount of vinyl groups taken into the film can be regulated through a change in plasma electric power, and, if the electric power is increased to 100 W or higher, vinyl groups become absent in the film.

The heat resistance tests conducted for the films comprising vinyl groups in structure showed that even after the films were heated at 450° C. for 1 hour in the nitrogen atmosphere, the film shrinkages were not exceeding 0.1% and the film characteristics hardly changed. In effect, the vinyl groups taken into the film obviously improve the heat resistance a great deal.

With respect to the dielectric constants, as in the case of containing no vinyl groups, it was found that their values change continuously with the deposition pressure from a dielectric constant of 3.2 for the film grown at 133 Pa to a dielectric constant of 4.2 for the film grown at 1330 Pa. In other words, the dielectric constants hardly change with the presence of vinyl groups in the film. Further, the C/Si composition ratios therein varied in a range of 0.9 to 1.4, while the film densities and the refractive indices of the films varied in ranges of 0.9/$cm^3$ to 1.4 $g/cm^3$ and 1.70 to 1.85, respectively.

In other words, there are hardly any change caused by the presence of vinyl groups in the film.

The films were found to have the excellent capability as a barrier against Cu, and in the accelerated Cu diffusion test conducted applying a bias voltage while heating to 450° C., no Cu diffusion was observed. This indicates that these films have the capability equivalent to the conventional SiCH films grown with 3MS.

While, in the examples described so far, trimethylvinylsilane is used as a source, it was established that, in addition to this, triethylvinylsilane, dimethyldivinylsilane, diethyldivinylsilane, methyltrivinylsilane, ethyltrivinylsilane, tetravinylsilane, tetraethylsilane and triethylsilane, every one of which is a polyorganosilane possible to be used as a source having a molecular weight of 100 or greater and a C/Si ratio of 5 or greater, may form a film of a similar quality.

Further, it has been confirmed that, in addition to the parallel plate type plasma CVD, the ECR excited plasma CVD, the helicon wave excited plasma CVD and the induction coupled plasma CVD can be used to obtain a film of the same excellent quality.

Next, in the third embodiment of the present invention, a SiCHN film is described below.

In the present embodiment, with a mass flow controller regulating the flow rates, trimethylvinylsilane and ammonia are each fed thereto at a rate of 300 sccm and H E is, concurrently, fed at a rate of 1000 sccm. At the time of the film deposition, the pressure is set to be 133 to 1330 Pa, the high frequency electric power, 100 to 400 W and the substrate temperature, 350° C.

With ammonia supplied at a rate of 300 sccm, nitrogen is fed into the film and thereby a SiCHN film is formed.

The values of the dielectric constants change continuously with the deposition pressure, from a dielectric constant of 3.8 for the film grown at 133 Pa to a dielectric constant of 4.7 for the film grown at 1330 Pa. Further, when the films are grown under the above conditions, the C/Si composition ratios therein vary in a range of 1.0 to 1.3, a range where the carbon content is greater than silicon content, while the film densities vary in a range of 1.4 $cm^3$ to 1.6 $g/cm^3$ so that the films are made to have lower densities than the SiCHN films (with a density of 1.7 $g/cm^3$) grown using 3MS.

Further, the refractive indices thereof vary in a range of 1.77 to 1.90. The results of the measurements of the FT-IR absorption spectroscopy indicated the presence of Si—C, Si—$CH_3$ and Si—H bonds. On the other hand, the Si—OH bands resulting from the moisture in the films were not detected.

The films were found to have the excellent capability as a barrier against Cu, and in the accelerated Cu diffusion test conducted applying a bias voltage while heating to 450° C., no Cu diffusion was observed. This indicates that these films have the capability equivalent to the conventional SiCHN films grown with 3MS.

While, in the examples described so far, trimethylvinylsilane is used as a source, it was established that, in addition to this, triethylvinylsilane, dimethyldivinylsilane, diethyldivinylsilane, methyltrivinylsilane, ethyltrivinylsilane, tetravinylsilane, tetraethylsilane and triethylsilane, every one of which is a polyorganosilane possible to be used as a source having a molecular weight of 100 or greater and a C/Si ratio of 5 or greater, may form a film of a similar quality, even if another nitridation source such as hydrazine is employed in place of ammonia.

Further, it has been confirmed that, in addition to the parallel plate type plasma CVD, the ECR excited plasma CVD, the helicon wave excited plasma CVD and the induction coupled plasma CVD can be used to obtain a film of the same excellent quality.

Next, as a modified example of the third embodiment, a SiCHN film containing vinyl groups therein is described below. As in the second embodiment wherein vinyl groups are contained in the film, the film deposition was made under the conditions that the flow rate of trimethylvinylsilane was increased from 300 sccm to a higher one, and moreover the plasma electric power was made as low as 50 to 100 W.

To examine the presence of vinyl groups in the film, measurements of the infrared absorption spectroscopy were conducted and the absorption attributable to vinyl groups was clearly observed in the sample film grown under the conditions of a high flow rate and a low high-frequency electric power of 50 to 100 W. This also occurs for the SiCHN film, because, in plasma with a weak energy, the source may be taken into a film without being broken down structurally.

It was also found that the Si—C, Si—$CH_3$ and Si—H bonds are all present in the film. On the other hand, the Si—OH bands resulting from the moisture in the film were not detected.

Meanwhile, when the electric power was increased to 100 W or higher, the absorption attributable to the vinyl groups disappeared and only the Si—C, Si—$CH_3$ and Si—H bonds were detected in the film.

It was demonstrated that a SiCHN film containing vinyl groups can be fabricated by using a source gas linking with vinyl groups and, at the same time, giving good attention to suppress the decomposition of the source gas. Further, it was found that the amount of vinyl groups taken into the film can be regulated through a change in plasma electric power.

Further, the heat resistance tests conducted for the films comprising vinyl groups in structure showed that even after the films were heated at 450° C. for 1 hour in the nitrogen atmosphere, the film characteristics hardly changed. In effect, the vinyl groups taken into the film obviously improve the heat resistance a great deal. Further, the values of the dielectric constants change continuously with the deposition pressure, from a dielectric constant of 3.8 for the film grown at 133 Pa to a dielectric constant of 4.7 for the film grown at 1330 Pa.

Further, the C/Si composition ratios in the film vary in a range of 1.0 to 1.3, a range where the carbon content is greater than silicon content, while the film densities and the refractive indices thereof vary in a range of 1.4 $g/cm^3$ to 1.6 $g/cm^3$ and 1.77 to 1.90, respectively. In other words, all of them hardly change with the presence of vinyl groups in the film. In short, the vinyl groups contained in the film have the effect of raising the heat resistance of the barrier film without increasing the dielectric constant significantly. The films were found to have an excellent capability as a barrier against Cu, and, in the accelerated Cu diffusion test conducted applying a bias voltage while heating to 450° C., no Cu diffusion was observed. This indicates that these films have the capability equivalent to the conventional SiCHN films grown with 3MS.

In the present embodiment, trimethylvinylsilane is used as a source, it was established that, in addition to this, triethylvinylsilane, dimethyldivinylsilane, diethyldivinylsilane, methyltrivinylsilane, ethyltrivinylsilane, tetravinylsilane, tetraethylsilane and triethylsilane, any one of which is a polyorganosilane possible to be used as a source having a molecular weight of 100 or greater and a source having a C/Si ratio of 5 or greater, can form a film of a similar quality.

Further, it has been confirmed that, in addition to the parallel plate type plasma CVD, the ECR excited plasma CVD, the helicon wave excited plasma CVD and the induction coupled plasma CVD can be used to obtain a film of the same excellent quality.

FIGS. 18 and 19 show the dielectric constants of the SiOC films and SiC films grown using either of 3MS and 4MS, together with the dielectric constants of the SiOCH films and SiCH films grown using, as a source, either of TMVS and DMVS whose respective molecular weights are both 100 or greater and C/Si ratios, both 5 or greater. Both of the SiOC films grown using either of 3MS and 4MS have a dielectric constant of 2.9, while the SiOC films grown with TMVS and DMVS have dielectric constants of 2.6 and 2.4, respectively. It is thereby demonstrated that the use of a source with a large molecular weight allows the film with a low electric constant to be formed.

Referring to the drawings, Examples in which an organic insulating film according to a preferred embodiment of the present invention is applied to a semiconductor device are described below.

Example 1

Figure 1:
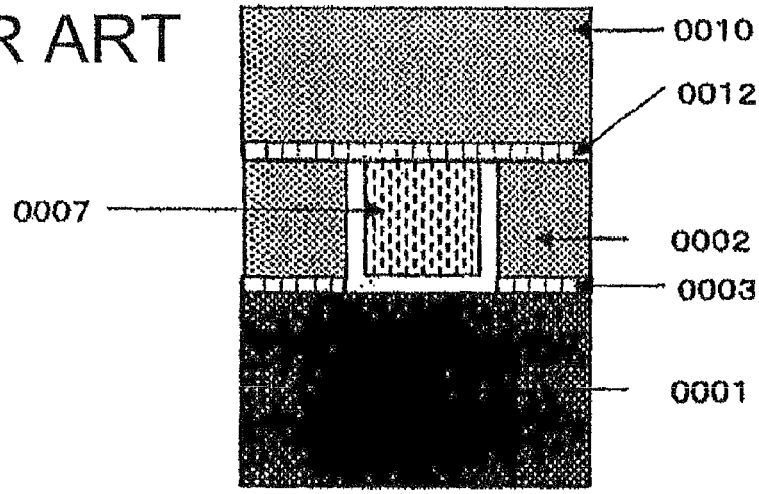
FIG. 1 is a schematic cross-sectional view in explaining a damascene structure.
Figure 2:
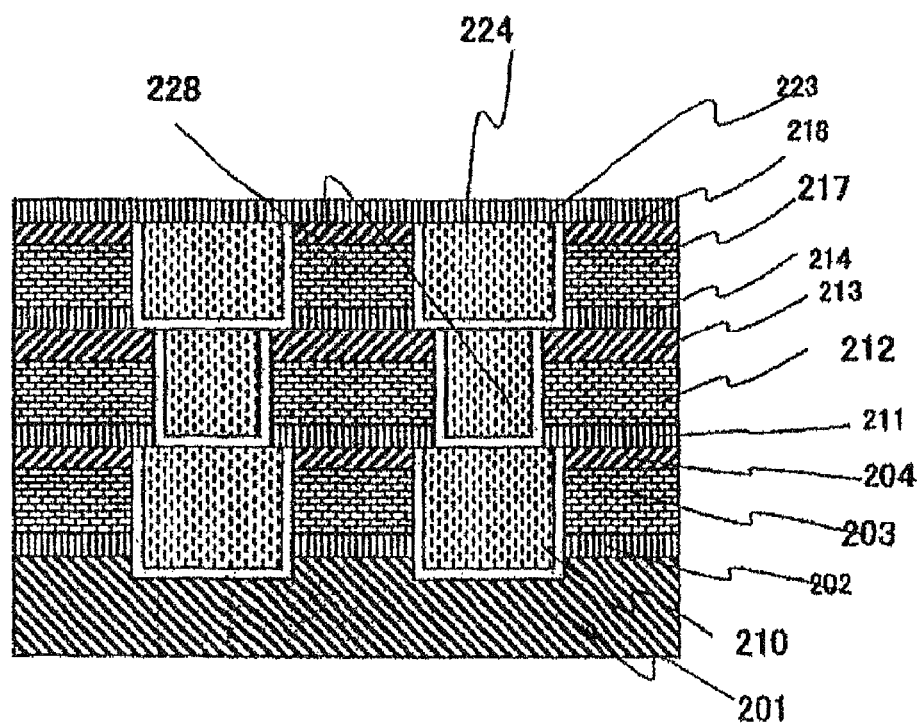
FIG. 2 is a schematic cross-sectional view showing a structure according to First Embodiment of the present invention.

FIG. 2 is a schematic partial cross-sectional view of a semiconductor device with a single damascene structure of Example 1.

In a semiconductor device shown in FIG. 2, upon an underlying insulating film 201 that covers elements such as MOS (Metal-Oxide-Semiconductor) transistors formed on a Si substrate, layers of a first etching stopper film 202, a first SiOCH film 203, a first hard mask film 204, a first barrier insulating film 211, a second SiOCH film 212, a second hard mask film 213, a second etching stopper film 214, a third SiOCH film 217, a third hard mask film 218 and a second barrier insulating film 223 are laid in succession.

In layers of insulating films, first copper interconnections 210, second copper interconnections 224 and copper plugs 228 each of which connects a first copper interconnection with a second copper interconnection are formed.

The first copper interconnections 210 are formed in layers of insulating films made of the first etching stopper film 202, the first SiOCH film 203 and the first hard mask film 204 which are laid in succession on the underlying insulating film 201.

The second copper interconnections 224 are formed in layers of insulating films made of the second etching stopper film 214, the third SiOCH film 217 and the third hard mask film 218.

The copper plugs 228 that connect the first copper interconnections which constitute lower layer interconnections with the second copper interconnections 224 which constitute upper layer interconnections are formed in a layered film made of the first barrier insulating film 211, the second SiOCH film 212 and the second hard mask film 213, which functions as an interlayer insulating film separating the upper layer interconnections and the lower layer interconnections.

A part of the first copper interconnection 210 may cut into the underlying insulating film 201.

Among the interlayer insulating films constituting the above structure, every one of the first and the second barrier insulating films and the first and the second etching stopper films can be a SiCH film, a SiCHN film or a layered film of a SiCH film and a SiCHN film as illustrated by way of example in FIG. 7(a), 402a-b and 411a-b.

Next, a method of manufacturing the afore-mentioned semiconductor device is described below, with reference to a series of schematic cross-sectional views illustrating the steps thereof and shown in FIGS. 3(a) to 6(d).

Figure 3A:
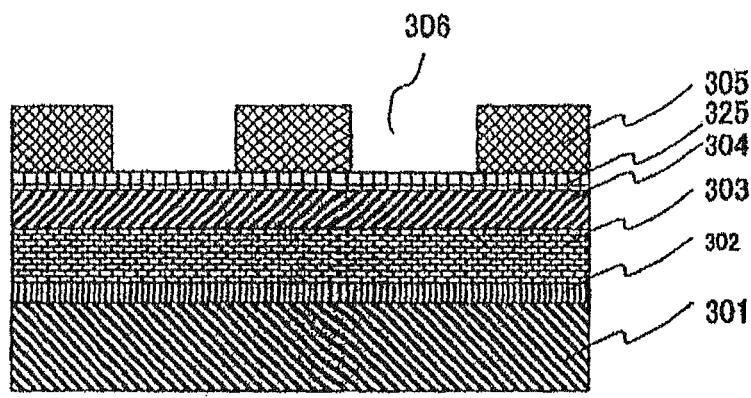
FIGS. 3(a)-3(d) are a series of schematic cross-sectional views illustrating the first process flow in a single damascene method according to the present invention.

Firstly, as shown in FIG. 3(a), on an underlying insulating film 301, a first etching stopper film 302, a first SiOCH film 303 and a first hard mask film 304 are grown in succession.

The first etching stopper film 302 can be either a SiCH film or a SiCHN film and grown to a thickness of 30 to 150 nm by the parallel plate type plasma CVD method. The first SiOCH film 303 is grown to a thickness of 200 to 1000 nm or so. The first hard mask film 304 is one of $SiO_2$, SiN and SiON films and grown to a thickness of 50 to 200 nm or so.

Over them, a first photoresist 305 is formed on the first hard mask film 304 and a trench pattern 306 is formed by means of photolithography.

Figure 3B:
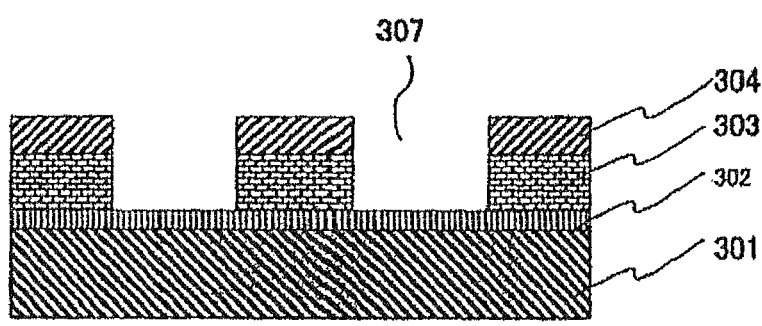

Subsequently, as shown in FIG. 3(b), using, as a mask, the first photoresist film 305 onto which the trench pattern 306 has been patterned, the first hard mask film 304 and the first SiOCH film 303 are etched by means of dry etching, and after the photoresist 305 is peeled off, the first etching stopper film 302 is removed by the etch back applied onto the entire surface thereof, whereby a first interconnection trench pattern 307 is formed.

Herein, when the first etching stopper film 302 is removed by etching, a part of the underlying insulating film may be removed by etching but this does not cause any serious problem.

The first etching stopper film 302 can be omitted. In this instance, only the first hard mask film 304 and the first SiOCH film 303 are removed by etching, with the first photoresist 305 being used as a mask.

Figure 3C:
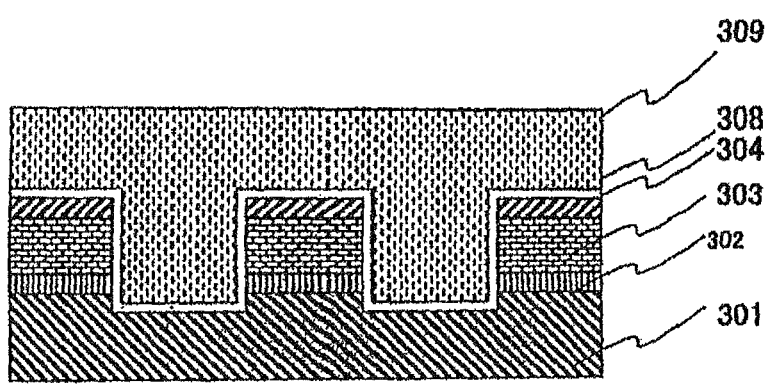

Next, as shown in FIG. 3(c), a first barrier metal film 308 and a first conductive film 309 are formed.

The first barrier metal film 308 is a film made of Ta, TaN, TiN or such and formed either by the sputtering method of the CVD method. The first conductive film 309 is either a Cu film or a Cu alloy film and formed by the sputtering method, the CVD method or the plating method.

Figure 3D:
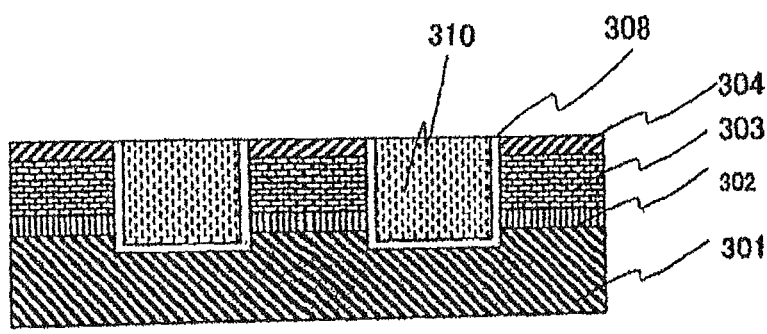

After that, as shown in FIG. 3(d), the first barrier metal film 308 and the first conductive film 309 lying on the hard mask film 304 are removed by the CMP and thereby first interconnections 310 are formed.

Figure 4A:
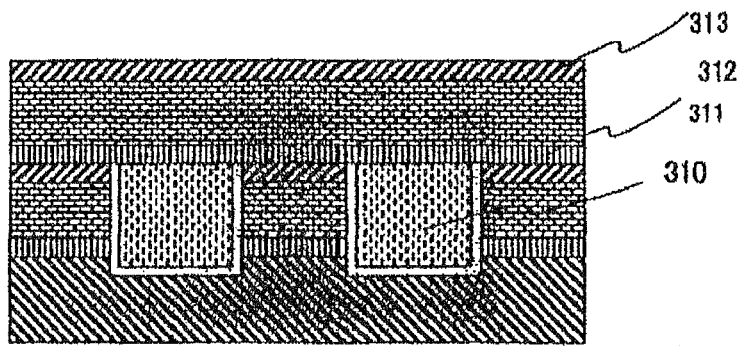
FIGS. 4(a)-4(d) are a series of schematic cross-sectional views illustrating the second process flow in the single damascene method according to the present invention.

Next, as shown in FIG. 4(a), a first barrier insulating film 311, a second SiOCH film 312 and a second hard mask film 313 are grown in succession.

Figure 4B:
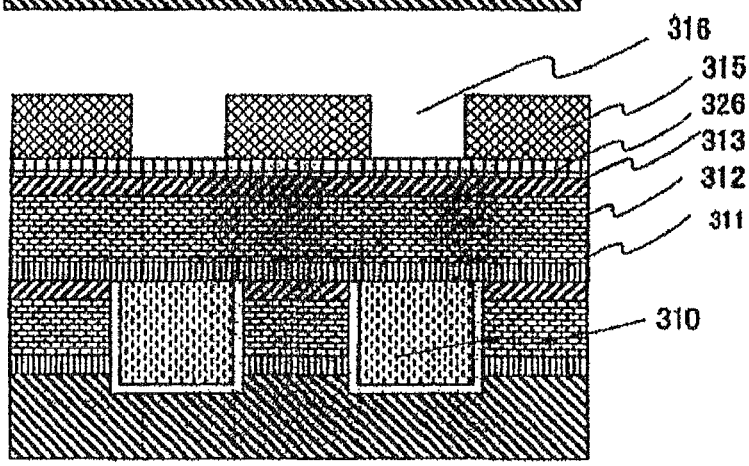

Next, as shown in FIG. 4(b), using a photoresist 315, a resist pattern for via hole 316 is formed thereon by photolithography in the same way as described above.

Figure 4C:
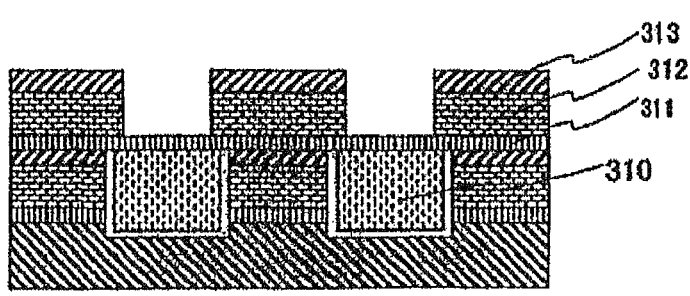
Figure 4D:
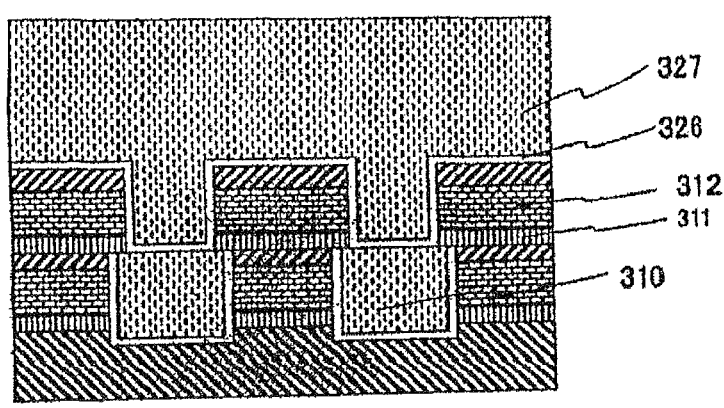

Next, the second hard mask film 313 and the second SiOCH film 312 are etched by means of dry etching and the second photoresist 315 is peeled off (FIG. 4(c)).

After that, the entire surface is subjected to the etch back to make the first barrier insulating film 311 open, and thereby a via pattern is formed.

Next, as shown in FIG. 4(a), a second barrier metal film 326 and a second conductive film 327 are formed.

The second barrier metal film 326 is a film made of Ta, TaN, TiN or such and formed either by the sputtering method of the CVD method. The second conductive film 327 is either a Cu film or a Cu alloy film and formed by the sputtering method, the CVD method or the plating method.

Figure 5A:
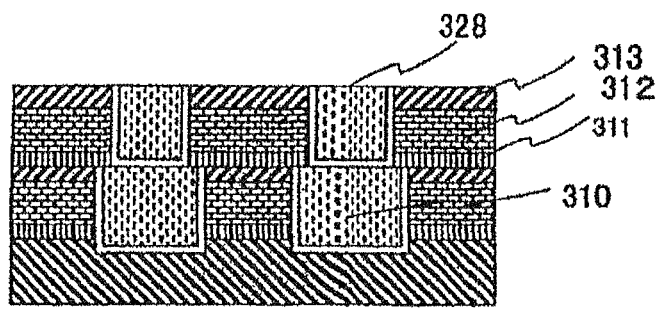
FIGS. 5(a)-5(d) are a series of schematic cross-sectional views illustrating the third process flow in the single damascene method according to the present invention.

After that, as shown in FIG. 5(a), the barrier metal film 326 and the second conductive film 327 lying on the hard mask film 313 are removed by the CMP and thereby first conductive plugs 328 are formed.

Figure 5B:
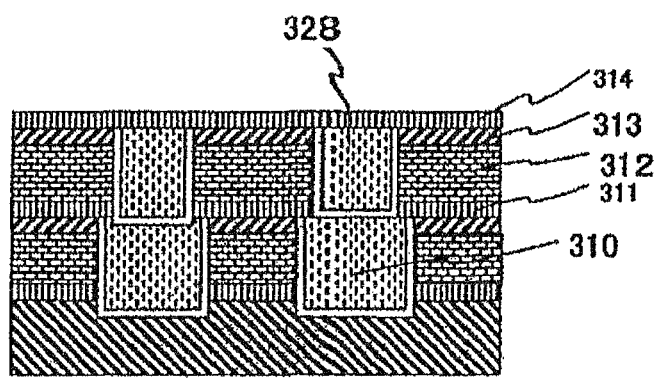

After that, as shown in FIG. 5(b), a second etching film 314 is formed thereon.

Figure 5C:
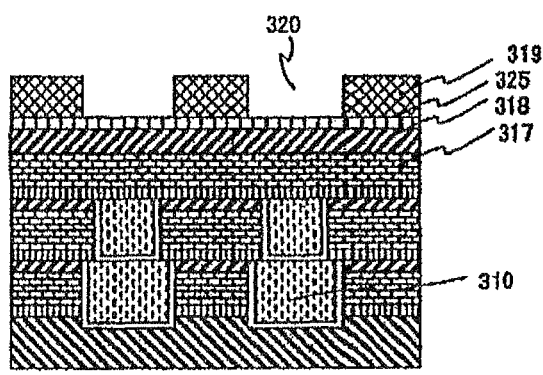

Further, as shown in FIG. 5(c), a third SiOCH film 317 is formed and thereon a third hard mask film 318 is formed. An anti-reflection coating film 325 is thereon formed and, using a third photoresist 319, a second resist pattern for interconnection trench 320 is further formed thereon.

Figure 5D:
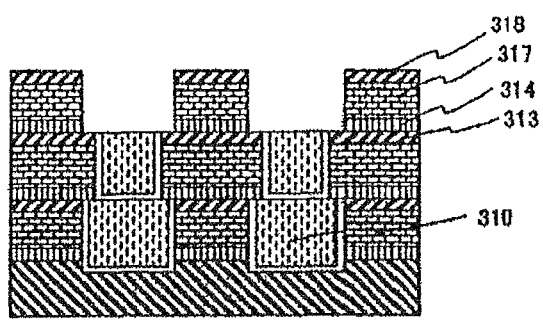

As shown in FIG. 5(d), using the third photoresist mask 319, etching for fabrication is applied onto the third hard mask film 318 and the third SiOCH film 317, and after peeling off the third photoresist 319, the entire surface thereof is subjected to the etch back to make the second etching stopper film 314 open in the form of the interconnection pattern.

The second etching stopper film 314 can be also omitted. On this occasion, using the third photoresist 319 as a mask, etching can be simply carried out. However, in this case, because the use of oxygen ashing to remove the photoresist may cause oxidation of the copper surface, the use of an organic solvent is required.

Figure 6A:
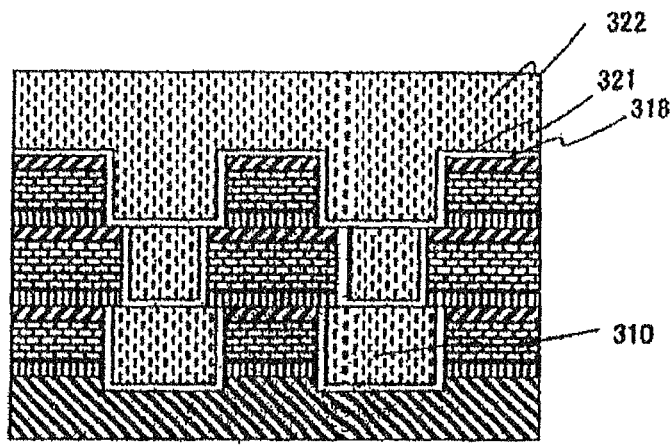
FIGS. 6(a)-6(c) are a series of schematic cross-sectional views illustrating the fourth process flow in the single damascene method according to the present invention.
Figure 6B:
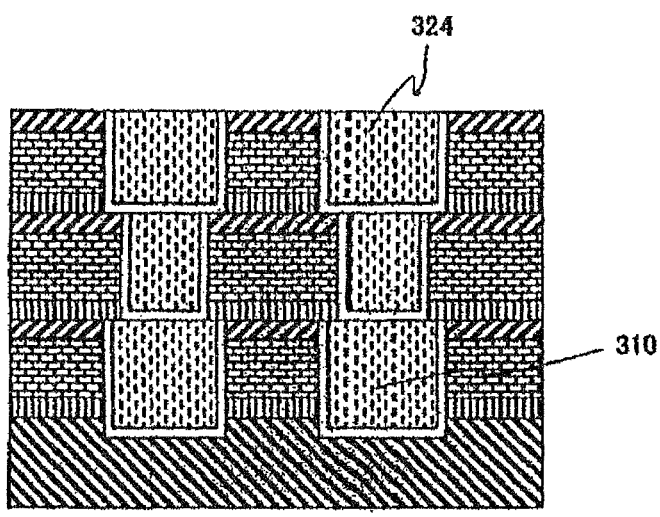

Following that, as shown in FIG. 6(a), a third barrier metal film 321 is formed and then a third conductive film 322 is formed. As shown in FIG. 6(b), the third barrier metal film 321 and the third conductive film 322 lying on the hard mask film 318 are removed by the CMP and thereby second interconnections 324 are formed.

Figure 6C:
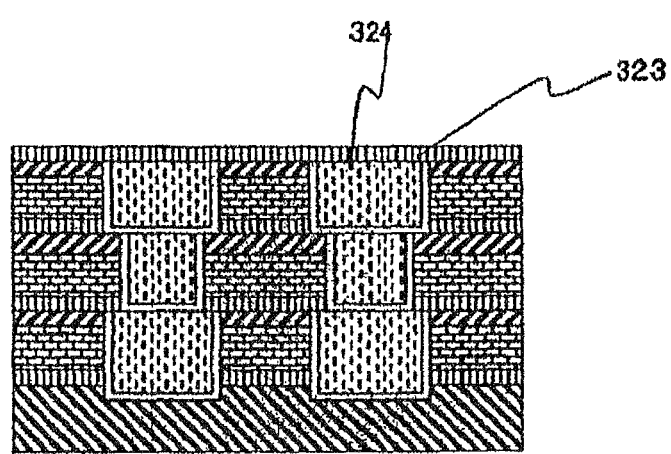

As shown in FIG. 6(c), a second barrier insulating film 323 is formed.

By repeating successively the above steps shown from FIG. 4(a) to FIG. 6(c), formation of a multi-layered interconnection may be accomplished.

While, in the present example, the upper layer interconnections, the lower layer interconnections and the via plugs to connect the upper layer interconnections with the lower layer interconnections are all formed of Cu films or Cu alloy films, it is not necessarily required to use Cu or Cu alloy, and silver or a silver containing alloy can be used. Further, a Cu film or a Cu alloy film can be used to form at least one but not all of the upper layer interconnections, the lower layer interconnections and the via plugs to connect the upper layer interconnections with the lower layer interconnections.

Further, a Cu containing alloy may further contain one or more metals selected from the group consisting of Si, Al, Ag, W, Mg, Be, Zn, Pd, Cd, Au, Hg, Pt, Zr, Ti, Sn, Ni and Fe.

The barrier metal may be made of one or more barrier metals selected from the group consisting of Ti, TiN, TiSiN, Ta, TaN and TaSiN.

The same as described above applies to a dual damascene structure described below.

Example 2

Next, as Example 2, a dual damascene structure is described below, referring to a schematic partial cross-sectional view of a dual damascene structure shown in FIG. 7.

In this semiconductor device, upon an underlying insulating film 401 that covers elements such as MOS transistors formed on a Si substrate, a first etching stopper film 402 which as noted above may be a laminate of an SiCH film 402a and an SiCHN film 402b, is formed to a thickness of 30 to 150 nm and thereon a first SiOCH film 403 is formed to a thickness of 200 to 500 nm, and thereon a first hard mask film 404 is further formed thereon to a thickness of 50 to 200 nm, and, in this layered insulating layer, first copper interconnections 410 are formed, and a second barrier insulating film 411, which as noted above may be a laminate of an SiCH film 411a and an SiCHN film 411b, is formed to a thickness of 30 to 150 nm so as to cover top sections of the copper interconnections. A second SiOCH film 412 is thereon formed to a thickness of 200 to 500 nm as an interlayer insulating film. Further, as an overlying layer thereof, a second etching stopper film 413, which as noted above may be a laminate of an SiCH film 413a and an SiCHN film 413b, with a thickness of 30 to 150 nm, and a third SiOCH film 414 with a thickness of 200 to 500 nm and a second hard mask film 417 with a thickness of 50 to 200 nm are formed. In this layered insulating film, second copper interconnections 422 are formed, and a second barrier insulating film 423 is further formed thereon to a thickness of 30 to 150 nm.

For the overlying layers, this step is performed repeatedly, and formation of multi-layered interconnections in the dual damascene structure is accomplished.

The etching stopper film(s) can be omitted in the dual damascene structure as in the single damascene structure.

Figure 7:
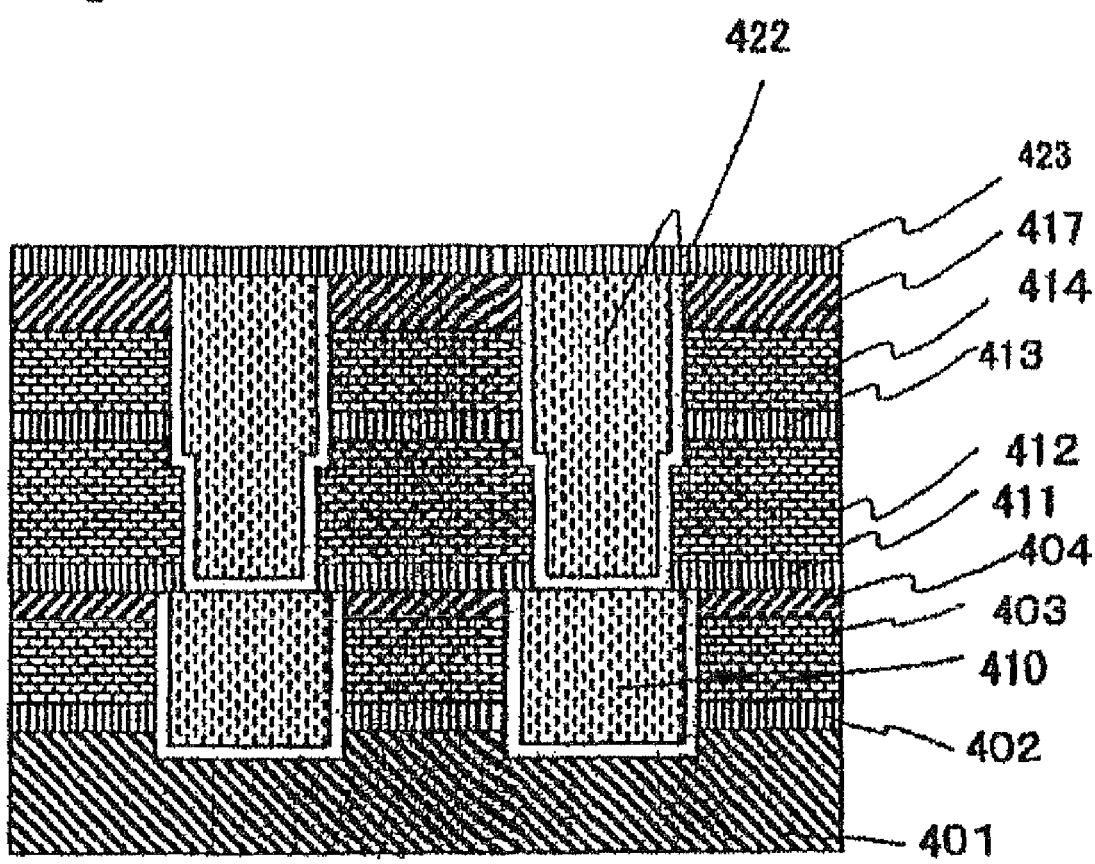
FIG. 7 is a schematic cross-sectional view showing a structure according to Second Embodiment of the present invention.
Figure 7A:
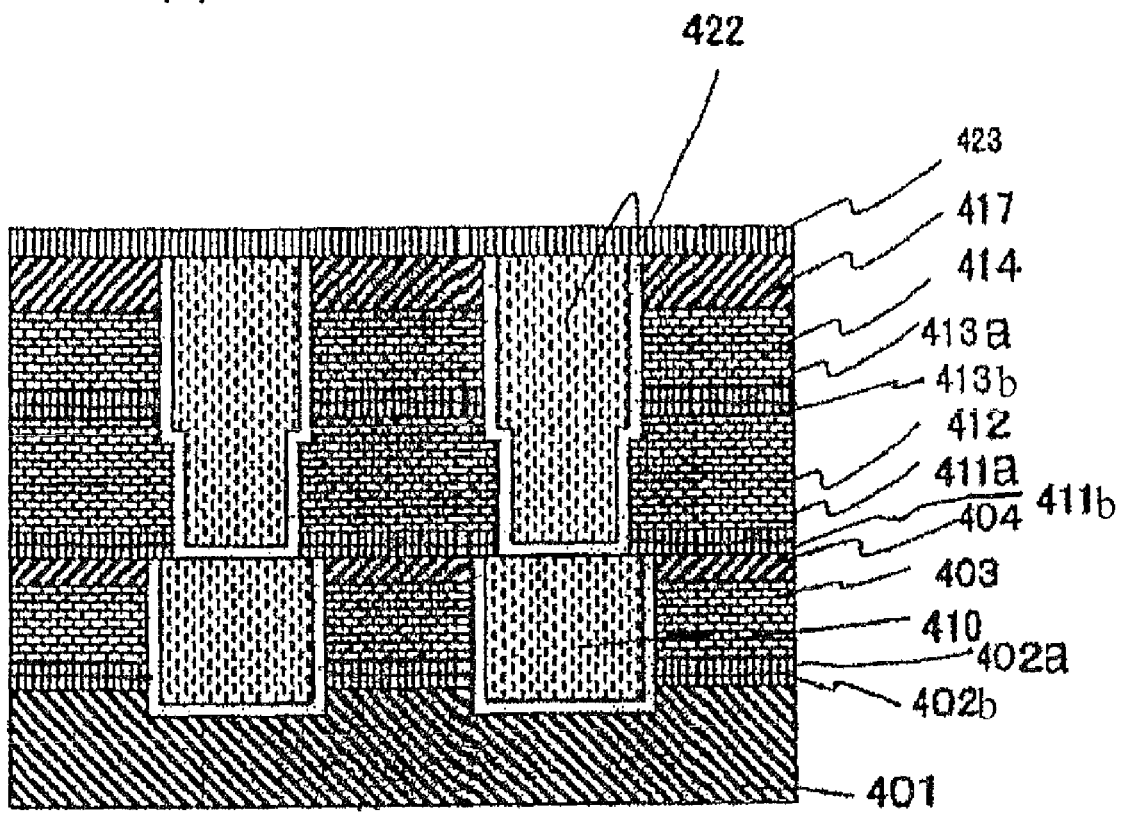
FIG. 7(a) is a view similar to FIG. 7 of yet another alternative embodiment of the present invention.

Next, referring to the drawings, a method of manufacturing a damascene structure shown in FIG. 7 is described below.

FIGS. 8(a) to 9(c) are a series of schematic cross-sectional views illustrating the steps of a manufacturing method of a damascene structure according to the via hole first method.

FIGS. 10(a) to 11(d) are a series of schematic cross-sectional views illustrating the steps of a manufacturing method of a damascene structure according to the middle first method.

FIGS. 12(a) to 14 are a series of schematic cross-sectional views illustrating the steps of a manufacturing method of a damascene structure according to the trench first method.

A manufacturing method of a dual damascene structure according to the via hole first method is described, referring to FIGS. 8(a) to 9(c).

Figure 8A:
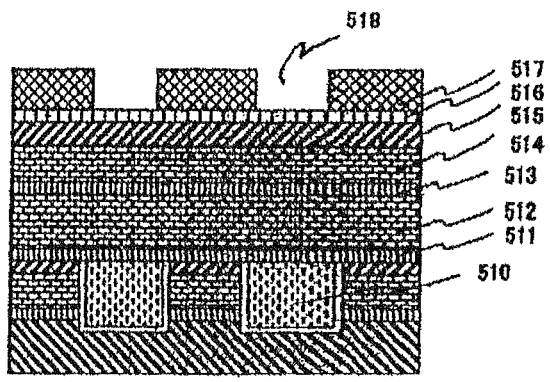
FIGS. 8(a)-8(d) are a series of schematic cross-sectional views illustrating the first via hole first process flow in a dual damascene method according to the present invention.
Figure 8B:
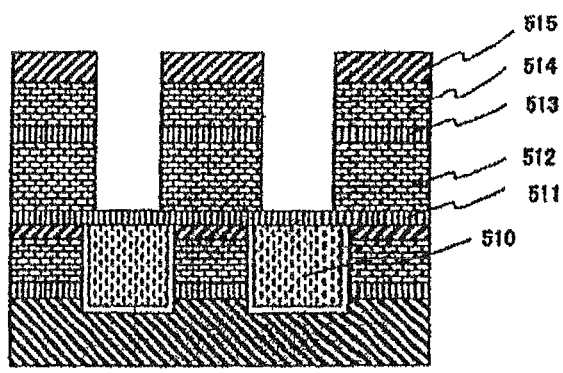

In the same way as shown in FIGS. 3(a) to 3(d), first Cu interconnections 510 are formed. Next, as shown in FIG. 8(a), a second SiCHN film 511 is formed and, thereon, a second SiOCH film 512, a third SiCHN film 513, a third SiOCH film 514 and a second $SiO_2$ film 515 are formed, and, overlying them, an anti-reflection coating film 516 is formed. A photoresist 517 is formed thereon and the exposure and development are made therethrough to form a resist pattern for via hole 518.

Next, using the photoresist 517 as a mask, etching is applied onto the second $SiO_2$ film 515, the third SiOCH film 514, the third SiCHN film 513 and the second SiOCH film 512, and this etching is stopped by the second SiCHN film 511. After that, the photoresist 517 is peeled off (FIG. 8(b)).

Figure 8C:
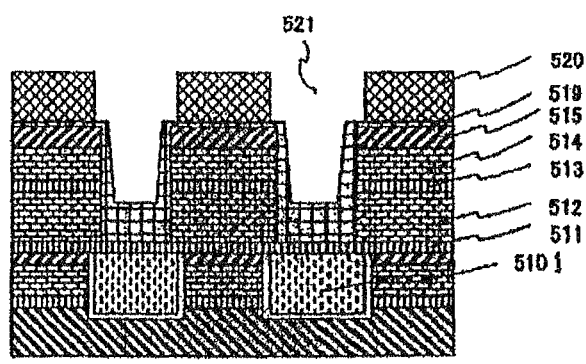

As shown in FIG. 8(c), a coating of an anti-reflection coating film 519 is made and, then, a photoresist 520 is made on the anti-reflection coating film 519, and then, exposure and development are applied thereto, whereby a second resist pattern for trench interconnection 521 is formed.

Figure 8D:
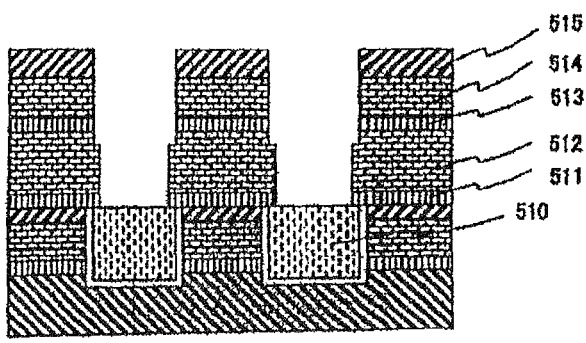

As shown in FIG. 8(d), using the photoresist 520 as a mask, etching is applied onto the second $SiO_2$ film 515 and the third SiOCH film 514. This etching is stopped by the third SiCHN film 513. After that, the photoresist 520 is removed, and another etch back is carried out to etch the second SiCHN film 511 and the third SiCHN film 513. Since the etching is hereat made to become slightly overetching, a part of the second SiOCH film 512 may be also removed by etching.

Figure 9A:
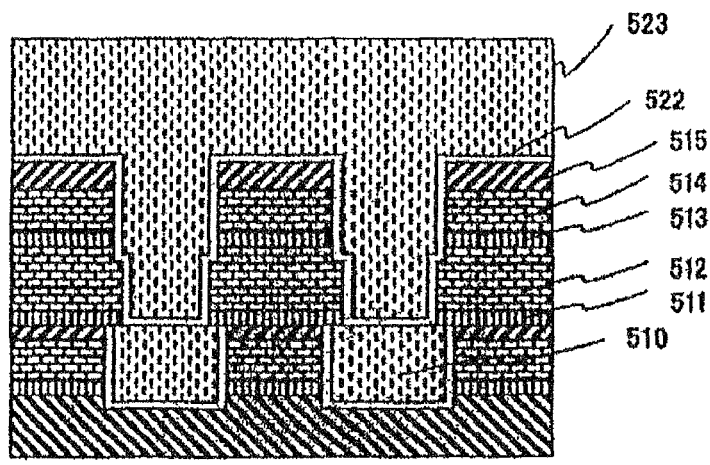
FIGS. 9(a)-9(c) are a series of schematic cross-sectional views illustrating the second via hole first process flow in the dual damascene method according to the present invention.
Figure 9B:
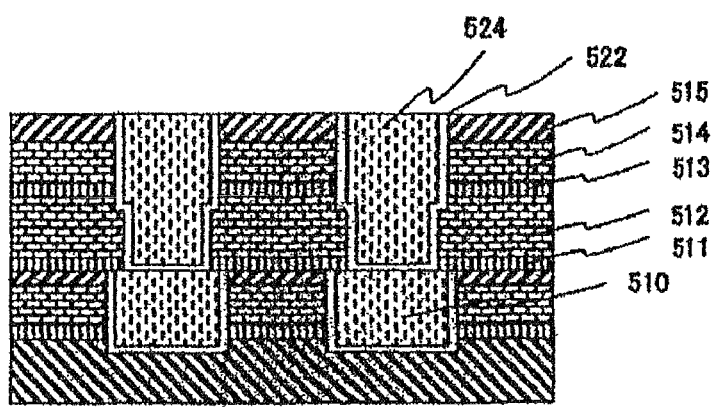

As shown in FIG. 9(a), a second Ta/TaN film 522 is then grown and thereafter a second Cu film 523 is grown. As shown in FIG. 9(b), by performing the CMP, metals other than the trench interconnections are removed to form second Cu interconnections 524.

Figure 9C:
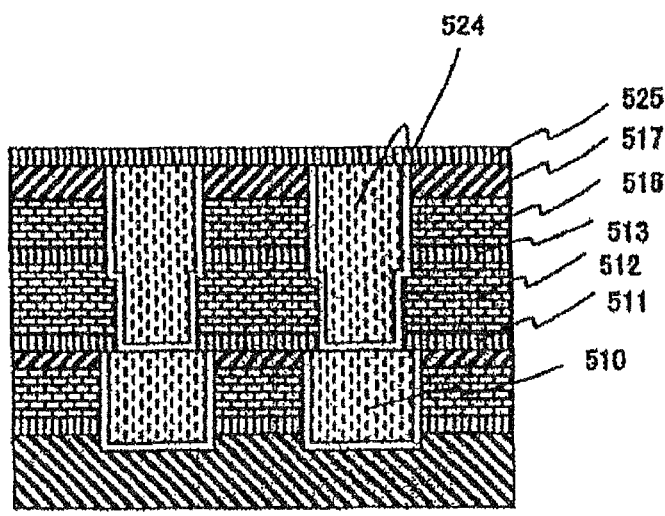

Subsequently, as shown in FIG. 9(c), a fourth SiCHN film 525 is grown.

Next, a manufacturing method of a dual damascene structure according to the middle first method is described, referring to FIGS. 10(a) to 11(d).

In the same way as shown in FIGS. 3(a) to 3(d), first Cu interconnections 610 are formed. Next, a second SiCH film 611 is formed thereon, and a second SiOCH film 612 is further formed thereon. Overlying them, a third SiCH film 613 is formed (FIG. 10(a)).

Figure 10A:
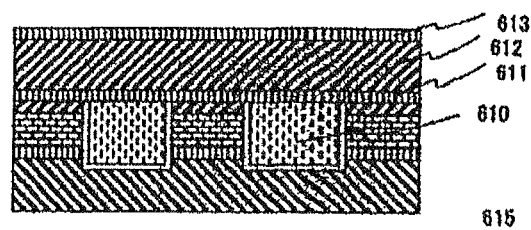
FIGS. 10(a)-10(d) are a series of schematic cross-sectional views illustrating the first middle first process flow in a dual damascene method according to the present invention.
Figure 10B:
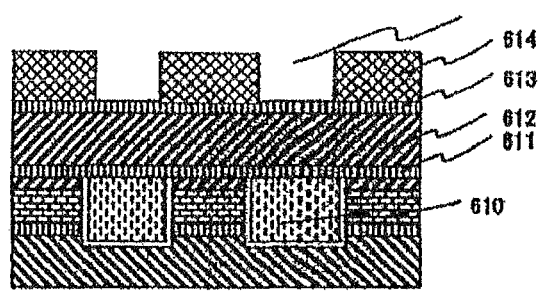

As shown in FIG. 10(b), on the third SiCH film 613, a photoresist 614 patterned with a resist pattern for via hole 615 is formed.

Figure 10C:
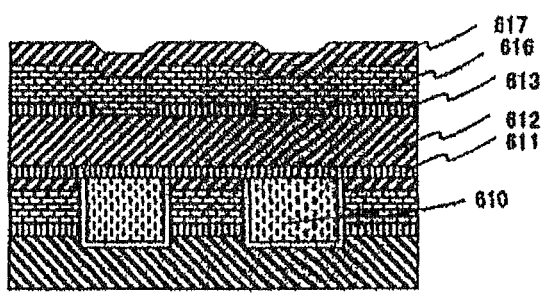

As shown in FIG. 10(c), using the photoresist 614 as a mask, the third SiCH film 613 is etched and, thereafter, an ashing and an organic peeling-off are conducted. Thereon, a third SiOCH film 616 and a third $SiO_2$ film 617 are formed.

Figure 10D:
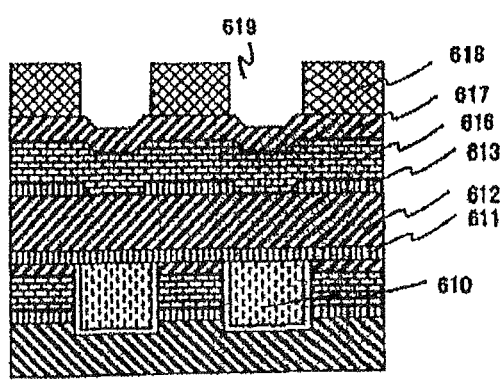

Next, as shown in FIG. 10(d), a photoresist 618 is formed so as to leave a second resist pattern for trench interconnection 619 therein.

Figure 11A:
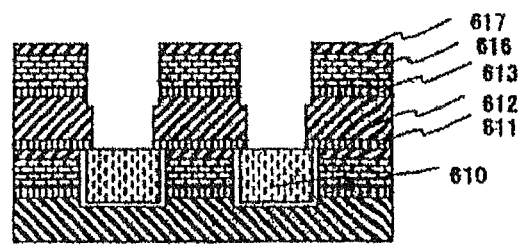
FIGS. 11(a)-11(d) are a series of schematic cross-sectional views illustrating the second middle first process flow in the dual damascene method according to the present invention.

As shown in FIG. 11(a), while using, as a mask, the photoresist 618 first and then the third $SiO_2$ film 617, the third SiOCH film 616 and the third SiCH film 613 one after another as the etching proceeds, the second SiOCH film 612 is worked into form. After that, by making the etch back, the second SiCH film 611 is etched.

Figure 11B:
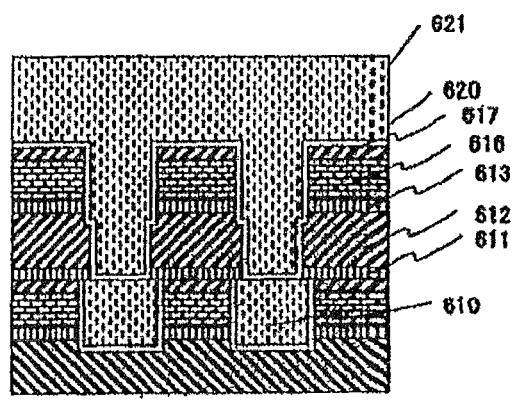
Figure 11C:
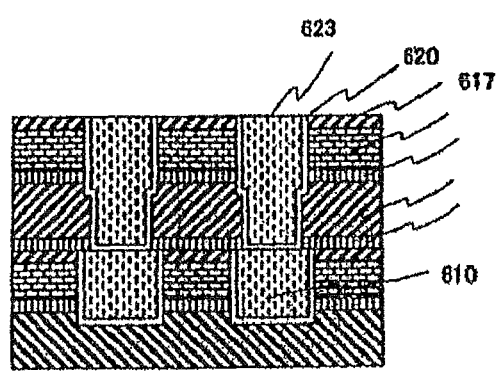
Figure 11D:
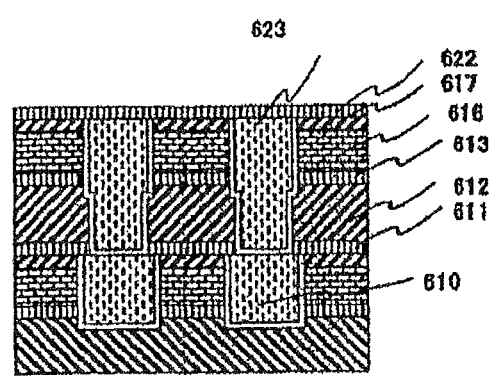

As shown in FIG. 11(b), a second Ta/TaN film 620 is grown. Further, a second Cu film 621 is grown. Following that, as shown in FIG. 11(c), the metal other than the trench interconnections is removed by the CMP to form second Cu interconnections 623 and, thereafter, as shown in FIG. 11(d), a fourth SiCH film 622 is formed.

Next, a manufacturing method of a dual damascene structure according to the trench first method is described, referring to FIGS. 12(a) to 14(a).

In the same way as shown in FIGS. 3(a) to 3(d), Cu interconnections 710 in a first layer are formed.

Figure 12A:
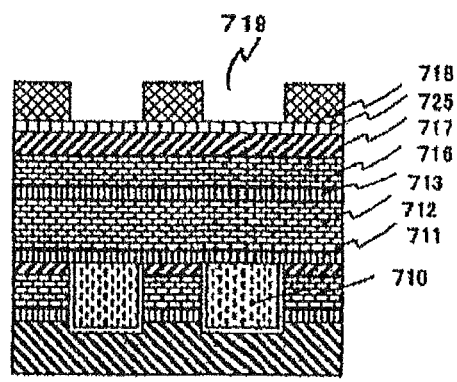
FIGS. 12(a)-12(d) are a series of schematic cross-sectional views illustrating the first trench first process flow in a dual damascene method according to the present invention.
Figure 12B:
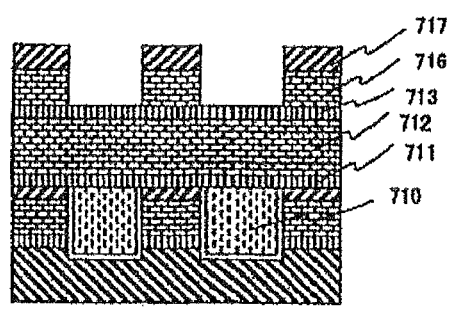

Next, as shown in FIG. 12(a), a second SiCH film 711, a second SiOCH film 712, a third SiCH film 713, a third SiOCH film 716 and a first $SiO_2$ film 717 are formed. Overlying them, an anti-reflection coating film 725 is formed and thereon a photoresist 718 is formed to leave a second resist pattern for trench interconnection 719. As shown in FIG. 12(b), with the photoresist mask, the first $SiO_2$ film 717 and the third SiOCH film 716 are etched and the third SiCH film 713 stops this etching, and, subsequently, the photoresist is subjected to ashing and then removed by the organic peeling-off.

Figure 12C:
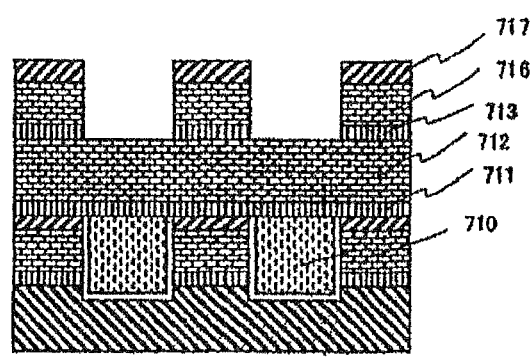

As shown in FIG. 12(c), the etch back is applied onto the entire surface thereof to etch the third SiCH film 713.

Figure 12D:
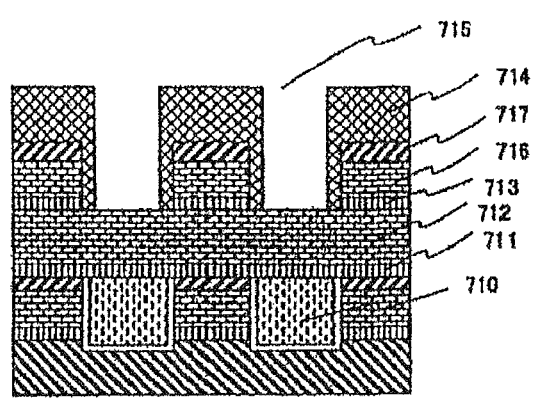

Next, as shown in FIG. 12(d), a photoresist 714 is formed to leave a resist pattern for via hole 715 therein.

Figure 13A:
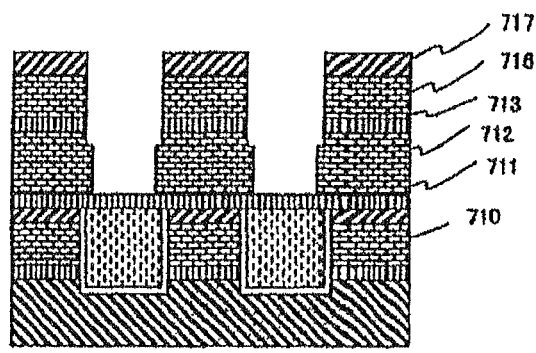
FIGS. 13(a)-13(d) are a series of schematic cross-sectional views illustrating the second trench first process flow in the dual damascene method according to the present invention.
Figure 13B:
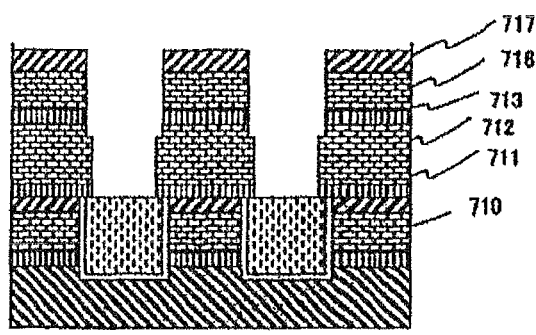

As shown in FIG. 13(a), using the photoresist 714 as a mask, the second SiOCH film 712 is etched, and, after the second SiCH film 711 stops the etching, the photoresist 714 is subjected to ashing and removed by the organic peeling-off. After that, as shown in FIG. 13(b), the etch back is applied onto the entire surface thereof to make the second SiCH film 711 open.

Figure 13C:
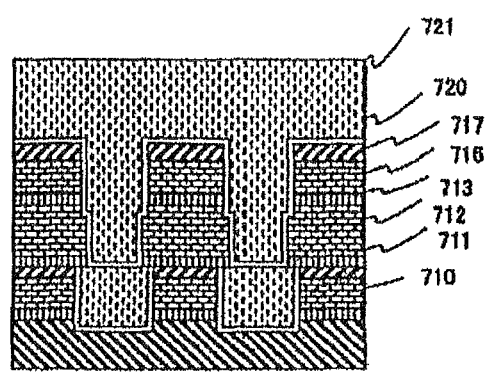
Figure 13D:
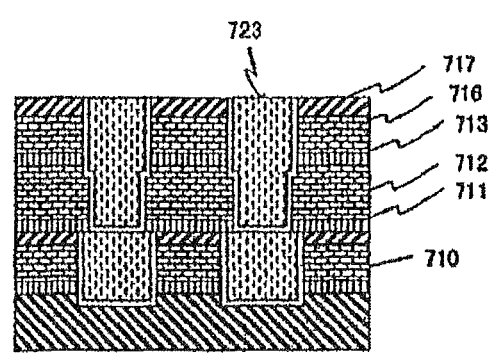
Figure 14:
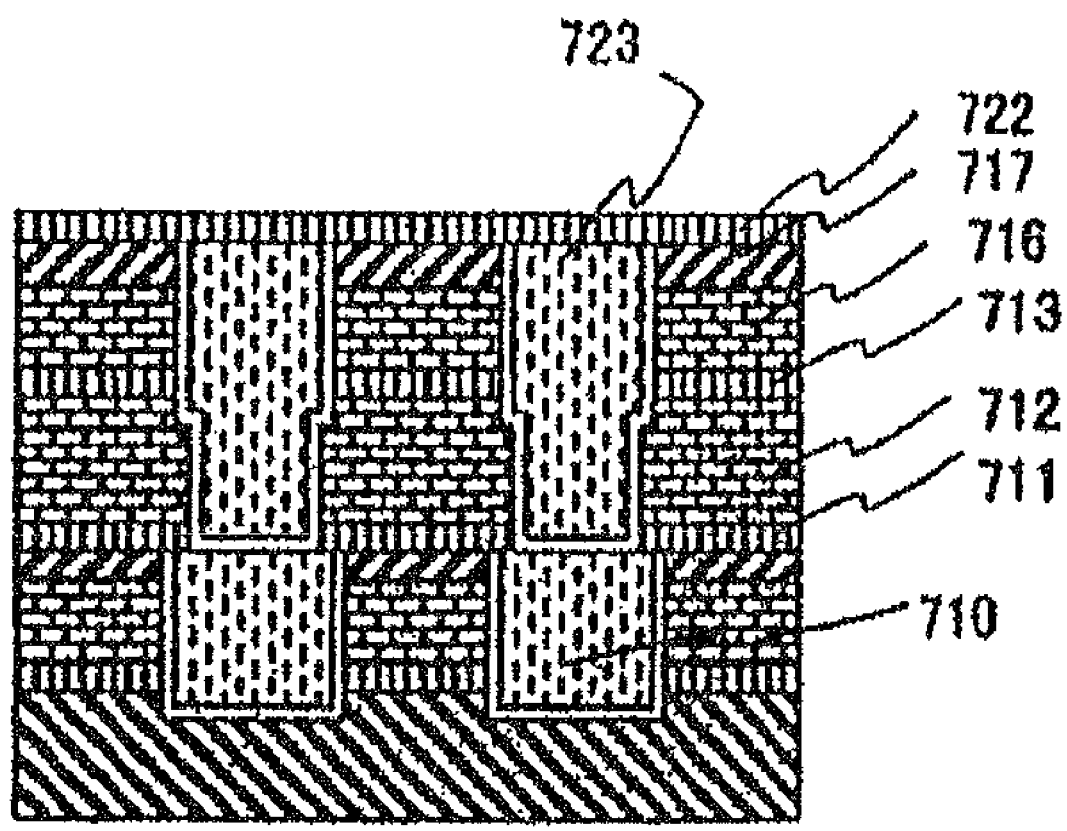
FIG. 14 is a series of schematic cross-sectional views illustrating the third trench first process flow in the dual damascene method according to the present invention.
Figure 15A:
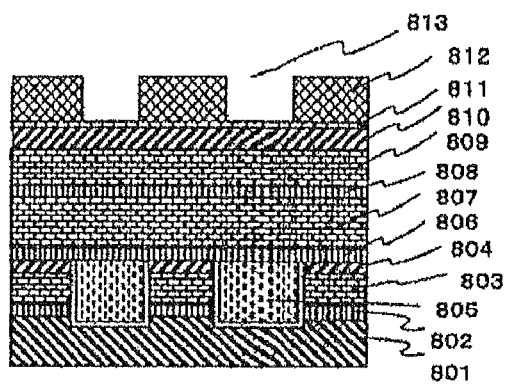
FIGS. 15(a)-15(d) are a series of schematic cross-sectional views illustrating the first via hole first process flow in a conventional dual damascene method.
Figure 15B:
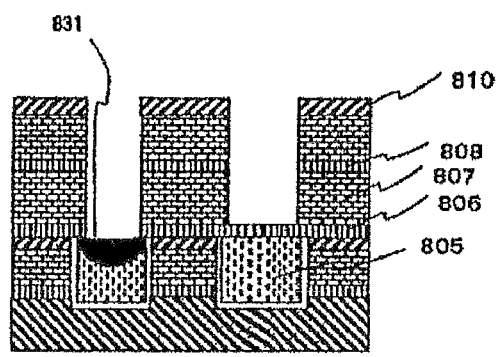
Figure 15C:
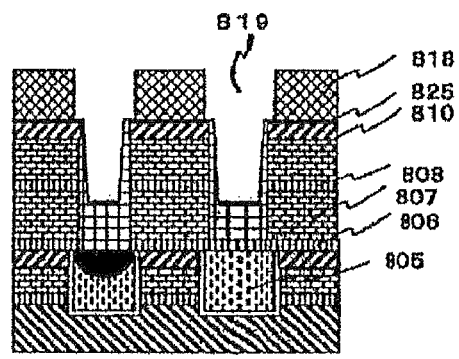
Figure 15D:
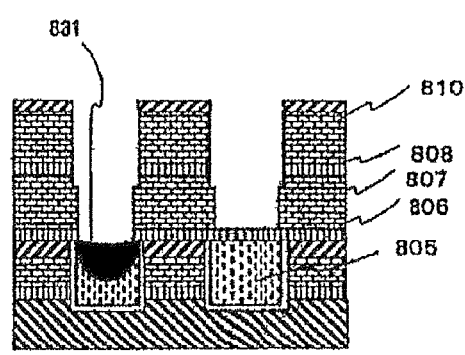
Figure 16A:
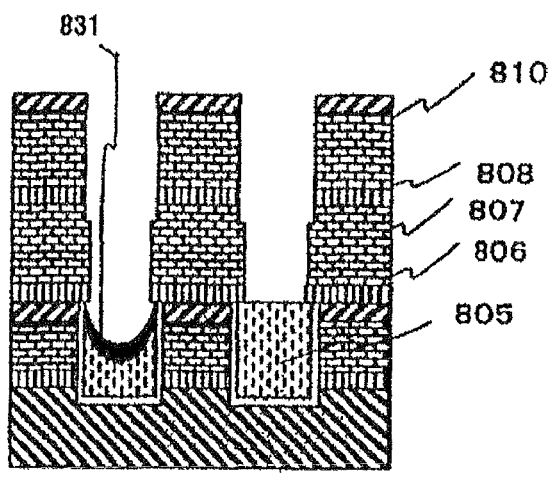
FIGS. 16(a)-16(c) are a series of schematic cross-sectional views illustrating the second via hole first process flow in the conventional dual damascene method.
Figure 16B:
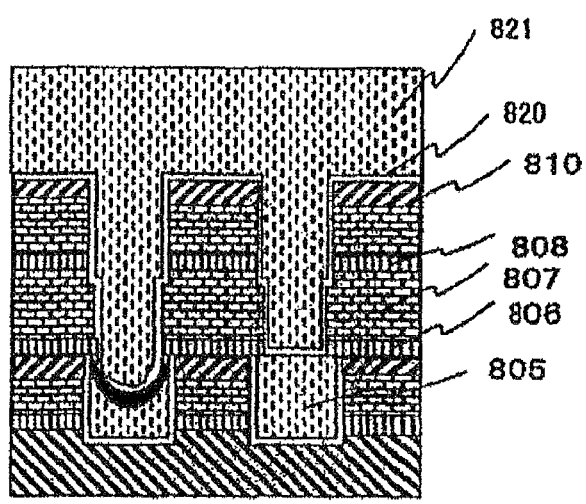
Figure 16C:
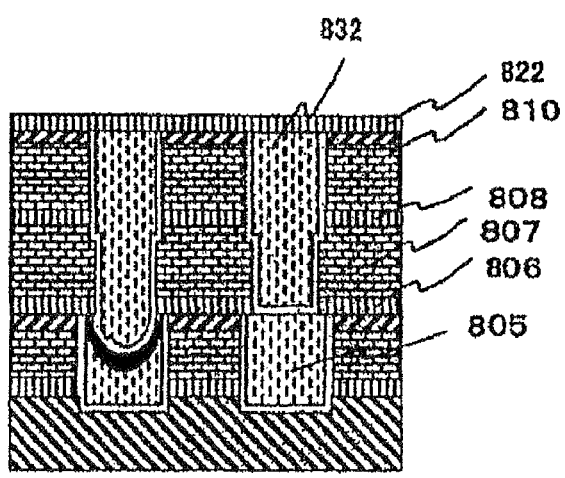

As shown in FIG. 13(c), a second Ta/TaN film 720 is grown and thereafter a second Cu film 721 is grown. Subsequently, after the metal other than the second copper interconnections is removed by the CMP as shown in FIG. 13(d), a fourth SiCH film 722 is grown thereon as shown in FIG. 14.

In the afore-mentioned Examples 1 and 2, SiCH and SiCHN are hereat equivalent and the substitution does not cause any serious problems.

Example 3

Example 3 wherein either of SiCH films and SiCHN films were used for the barrier insulating films in a semiconductor device is described below.

In a semiconductor device shown in FIG. 2, SiCH films were utilized for the insulating films 202, 211, 214 and 223.

For these SiCH films, SiCH films containing vinyl groups therein and having a dielectric constant of 3.8 were hereat employed. The examination of the heat resistance conducted for the obtained layered structure at temperatures up to 450° C. showed its excellent characteristics without any hint of deterioration in the via hole yield even when heated to 450° C. Further, it was found that the effective dielectric constant was reduced by 10%, compared with a semiconductor device wherein SiCH films with a dielectric constant of 4.5 which were grown using 3MS were employed.

In a semiconductor device shown in FIG. 2, SiCHN films that are Third Embodiment were utilized for the insulating films 202, 211, 214 and 223.

For these SiCHN films, SiCHN films containing vinyl groups therein and having a dielectric constant of 4.2 were hereat employed. The examination of the heat resistance conducted for the obtained layered structure at temperatures up to 450° C. showed its excellent characteristics without any hint of deterioration in the via hole yield even when heated to 450° C. Further, it was found that the effective dielectric constant was reduced by 10%, compared with a semiconductor device wherein SiCH films with a dielectric constant of 5 which were grown using 3MS were employed.

The present invention provides a method of manufacturing a SiOCH film of high quality with a low dielectric constant. Further, the present invention can provide a semiconductor device structure which can reduce an effective dielectric constant, while maintaining the interconnection reliability by applying, as a low-dielectric-constant insulating film, the above SiOCH film to a multi-layered interconnection in a semiconductor device.

The present invention can provide respective manufacturing methods of a SiCH and a SiCHN barrier insulating film of high quality with a low dielectric constant. Further, the present invention can provide a semiconductor device structure which can reduce an effective dielectric constant, while maintaining the interconnection reliability by applying, as a barrier insulating film, either of the above SiOCH film and SiCHN film to a multi-layered interconnection in a semiconductor device.

Further, the obtained films have excellent film quality, and carbon contents in the films are greater than those in conventional SiC films and SiCN films, and, as a result, the present invention with the SiCHN films can provide higher etching selection ratios than the prior art with the conventional SiOC films or SiOCH films.

Figure 21:
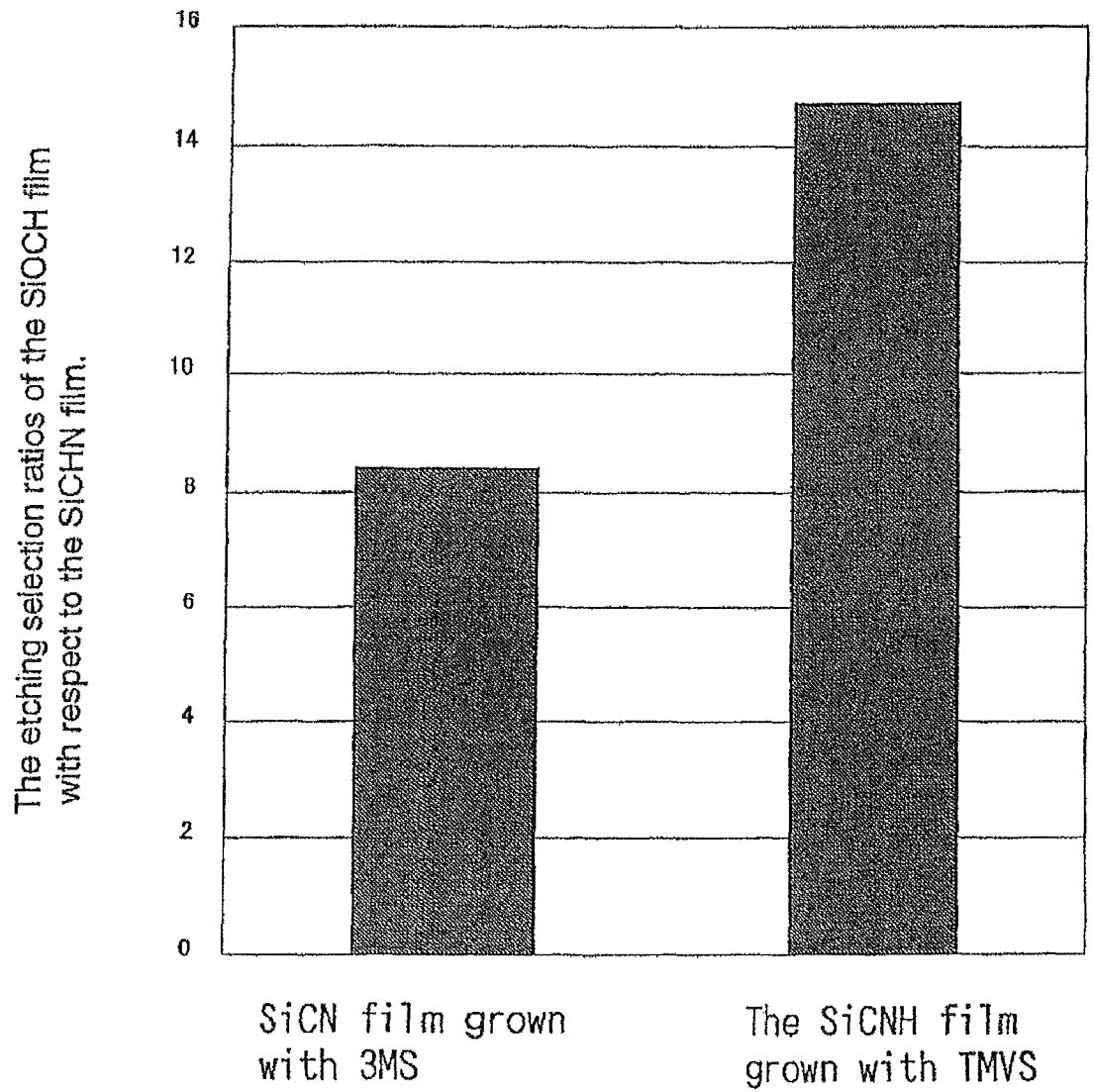
FIG. 21 is a graphical representation showing the etching selection ratios of the SiOCH film with respect to the SiCHN film.

Respective data for the etching selection ratio of the SiOCH film to the SiCHN film according to the prior art and the present invention are shown in FIG. 21. For the etching gas, a CF-based gas was employed. The SiCN film grown with 3MS and $NH_3$ and H E has a low carbon content in the film so that the etching selection ratio of the SiOC film to the SiCN film was as low as 8 and not sufficiently high. In contrast with this, with respect to the SiCHN film that was grown with TMVS, the etching selection ratio of the SiOCH film obtained was approximately 15 and satisfactorily high. The yield for a chain of 500,000 via holes with a diameter of 0.2 μm thereat is shown in FIG. 22.

Figure 22:
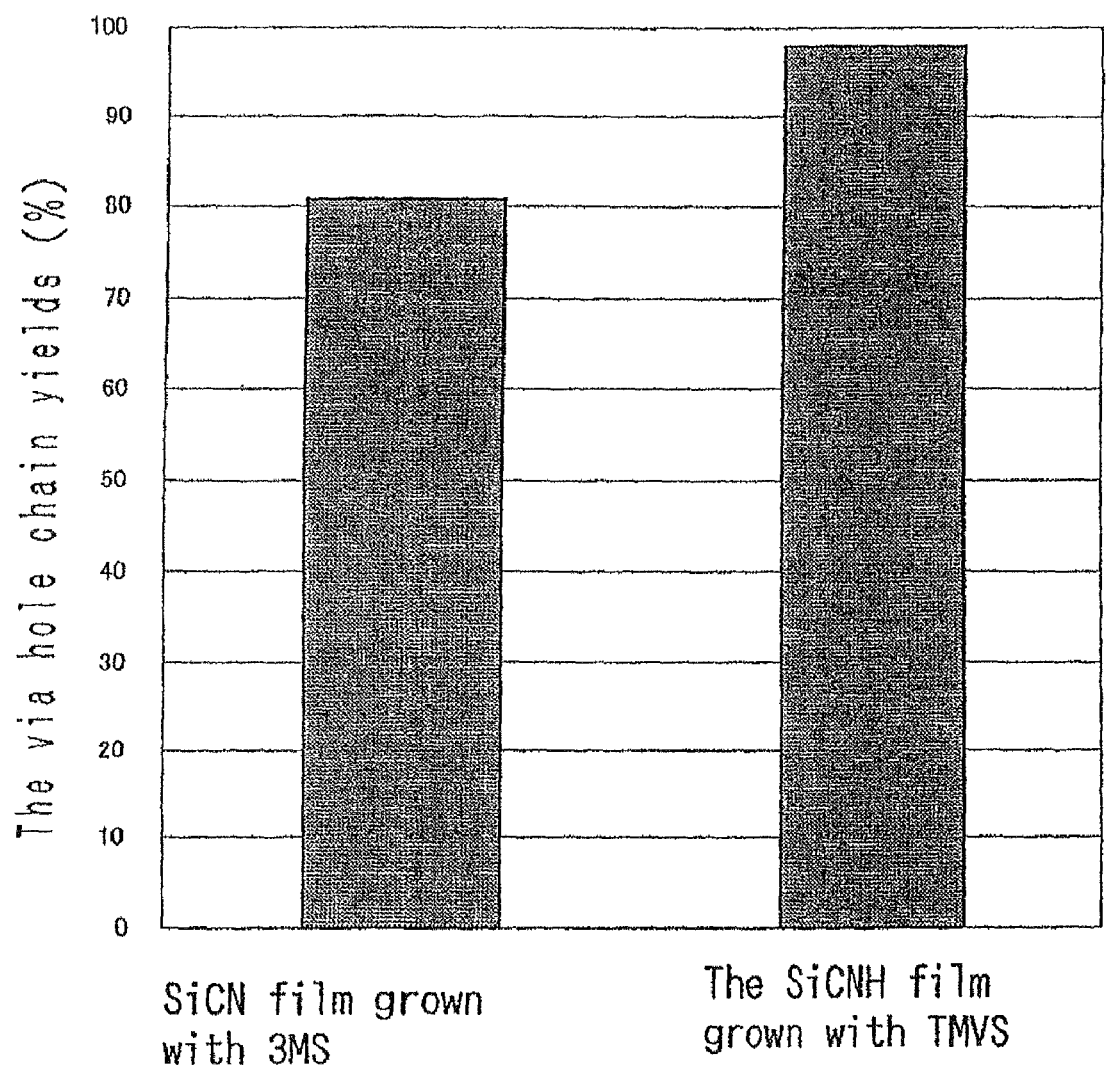
FIG. 22 is a graphical representation showing the comparison of the via hole chain yields between the present invention and the prior art.

FIG. 22 is a graphical representation of the yields for the via holes in the dual damascene interconnections formed by the via hole first method. When the conventional SiCN films formed with 3MS were used, the via hole yield was approximately 80%. As against this, when the SiCHN film formed with TMVS was used, the yield obtained was approximately 98%.

While what is shown herein is the data for the yields of the via holes in the dual damascene interconnections formed by the via hole first method, also in the dual damascene interconnections formed by the middle first method, the SiCH film of the present invention, which was formed with TMVS, provided a higher yield.

Figure 23:
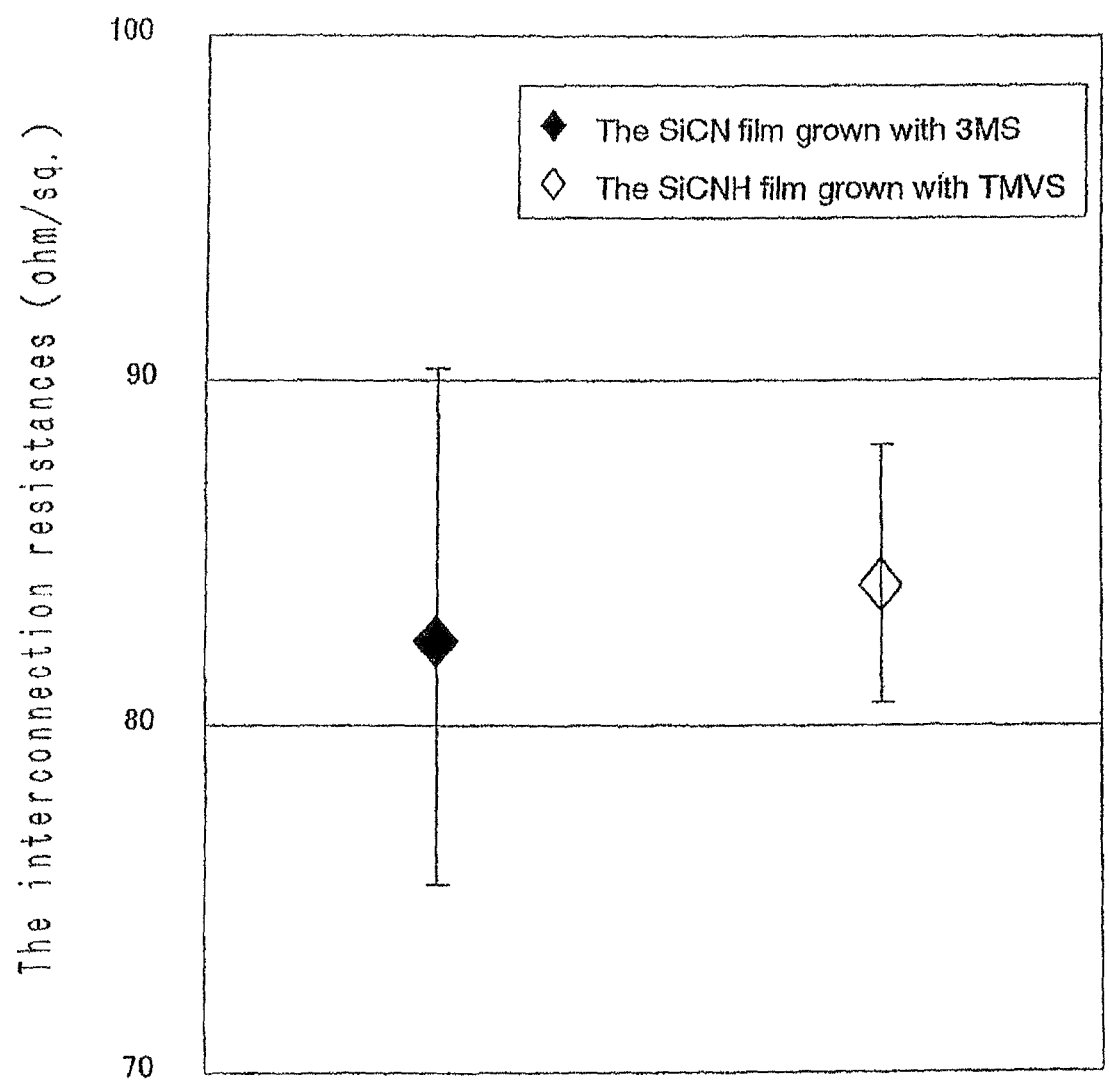
FIG. 23 is a graphical representation showing the comparison of the variations of the interconnection resistances between the present invention and the prior art.

Further, FIG. 23 is a graphical representation for the interconnection resistances in the dual damascene interconnections fabricated by the trench first method.

Another effect of the present invention was observed on the variation of the layer resistance in the film structure wherein the SiCHN film of the present invention, which was formed with TMVS, was utilized. The decrease in variation of the layer resistance was also brought about by the improvement of the etching selection ratio with respect to the etching stopper film. As shown in FIG. 23, for the conventional etching stopper films of the SiCHN films grown with 3MS, the resistances varied from 75 to 90Ω, while the variation of the resistances for the SiCHN films grown with TMVS in accordance with the present invention was almost halved.

What is claimed is:

1. A semiconductor device having a trench interconnection structure, which comprises:
    an interlayer insulating film formed on a semiconductor substrate,
    a trench interconnection formed in the interlayer insulating film, and
    a barrier insulating film formed so as to cover over the trench interconnection,
    wherein the barrier insulating film is formed by using a SiCHN film containing C=C bonds therein.

2. The semiconductor device as claimed in claim 1, wherein the interlayer insulating film is formed by using a SiOCH film containing C=C bonds therein.

3. The semiconductor device as claimed in claim 1, wherein the barrier insulating film is a layered film made of the SiCHN film and a SiCH film.

4. The semiconductor device as claimed in claim 1, wherein the SiCHN film containing C=C bonds therein has a C/Si composition ratio of 1.0 to 1.3.

5. The semiconductor device as claimed in claim 1, wherein the SiCHN film containing C=C bonds therein has a density of 1.4 g/cm$^3$ to 1.6 g/cm$^3$.

6. A semiconductor device having a trench interconnection structure, which comprises:
    an interlayer insulating film formed on a semiconductor substrate, and
    a trench interconnection formed in the interlayer insulating film,
    wherein the interlayer insulating film is a layered insulating film in which an etching stopper film is included, and the etching stopper film is formed by using a SiCHN film containing C=C bonds therein.

7. The semiconductor device as claimed in claim 6, wherein the interlayer insulating film is a layered insulating film comprising a SiOCH film containing C=C bonds therein and the etching stopper film.

8. The semiconductor device as claimed in claim 6, wherein the etching stopper film is a layered film made of the SiCHN film and a SiCH film.

9. The semiconductor device as claimed in claim 6, wherein the SiCHN film containing C=C bonds therein has a C/Si composition ratio of 1.0 to 1.3.

10. The semiconductor device as claimed in claim 6, wherein the SiCHN film containing C=C bonds therein has a density of 1.4 g/cm$^3$ to 1.6 g/cm$^3$.

11. A semiconductor device having a trench interconnection structure, which comprises:
    a first insulating film formed on a semiconductor substrate,
    a first trench interconnection formed in the first insulating film,
    a second insulating film,
    a third insulating film,
    a second trench interconnection formed in the third insulating film, and
    a via plug that is formed in the second insulating film and connects the first trench interconnection and the second trench interconnection,
    wherein the first insulating film is a layered insulating film comprising a SiOCH film and an etching stopper film, and the etching stopper film is formed by using a SiCHN film containing C=C bonds therein.

12. The semiconductor device as claimed in claim 11, wherein the SiOCH film contains C=C bonds therein.

13. The semiconductor device as claimed in claim 11, wherein the SiCHN film containing C=C bonds therein has a C/Si composition ratio of 1.0 to 1.3.

14. The semiconductor device as claimed in claim 11, wherein the SiCHN film containing C=C bonds therein has a density of 1.4 g/cm$^3$ to 1.6 g/cm$^3$.

15. A semiconductor device having a trench interconnection structure, which comprises:
    a first insulating film formed on a semiconductor substrate,
    a first trench interconnection formed in the first insulating film,
    a second insulating film,
    a third insulating film,
    a second trench interconnection formed in the third insulating film, and
    a via plug that is formed in the second insulating film and connects the first trench interconnection and the second trench interconnection,
    wherein the second insulating film is a layered insulating film comprising a SiOCH film and a barrier insulating film, and the barrier insulating film is formed by using a SiCHN film containing C=C bonds therein.

16. The semiconductor device as claimed in claim 15, wherein the SiOCH film contains C=C bonds therein.

17. The semiconductor device as claimed in claim 15, wherein the SiCHN film containing C=C bonds therein has a C/Si composition ratio of 1.0 to 1.3.

18. The semiconductor device as claimed in claim 15, wherein the SiCHN film containing C=C bonds therein has a density of 1.4 g/cm$^3$ to 1.6 g/cm$^3$.

19. A semiconductor device having a trench interconnection structure, which comprises:
    a first insulating film formed on a semiconductor substrate,
    a first trench interconnection formed in the first insulating film,
    a second insulating film,
    a third insulating film,
    a second trench interconnection formed in the third insulating film, and
    a via plug that is formed in the second insulating film and connects the first trench interconnection and the second trench interconnection,
    wherein the second insulating film is a layered insulating film comprising a SiOCH film and an etching stopper film, and the etching stopper film is formed by using a SiCHN film containing C=C bonds therein.

20. The semiconductor device as claimed in claim 19, wherein the SiOCH film contains C=C bonds therein.

21. The semiconductor device as claimed in claim 19, wherein the SiCHN film containing C=C bonds therein has a C/Si composition ratio of 1.0 to 1.3.

22. The semiconductor device as claimed in claim 19, wherein the SiCHN film containing C=C bonds therein has a density of 1.4 g/cm$^3$ to 1.6 g/cm$^3$.

23. A semiconductor device having a trench interconnection structure, which comprises:

a first insulating film formed on a semiconductor substrate, a first trench interconnection formed in the first insulating film, a second insulating film, a third insulating film, a second trench interconnection formed in the third insulating film, and a via plug that is formed in the second insulating film and connects the first trench interconnection and the second trench interconnection, wherein the third insulating film is a layered insulating film comprising a SiOCH film and an etching stopper film, and the etching stopper film is formed by using a SiCHN film containing C=C bonds therein.

24. The semiconductor device as claimed in claim 23, wherein the SiOCH film contains C=C bonds therein.

25. The semiconductor device as claimed in claim 23, wherein the SiCHN film containing C=C bonds therein has a C/Si composition ratio of 1.0 to 1.3.

26. The semiconductor device as claimed in claim 23, wherein the SiCHN film containing C=C bonds therein has a density of 1.4 g/cm$^3$ to 1.6 g/cm$^3$.

* * * * *